United States Patent
Hattori et al.

(10) Patent No.: US 9,947,466 B2
(45) Date of Patent: Apr. 17, 2018

(54) ELECTRONIC COMPONENT

(71) Applicant: Murata Manufacturing Co., Ltd., Nagaokakyo-shi, Kyoto-fu (JP)

(72) Inventors: Kazuo Hattori, Nagaokakyo (JP); Isamu Fujimoto, Nagaokakyo (JP); Hirobumi Adachi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/663,725

(22) Filed: Mar. 20, 2015

(65) Prior Publication Data
US 2015/0270065 A1    Sep. 24, 2015

(30) Foreign Application Priority Data

Mar. 24, 2014    (JP) ................. 2014-059984

(51) Int. Cl.
*H05K 1/03*    (2006.01)
*H01G 2/06*    (2006.01)
*H01G 4/30*    (2006.01)
*H01G 4/232*    (2006.01)
(Continued)

(52) U.S. Cl.
CPC ............. *H01G 2/065* (2013.01); *H01G 4/232* (2013.01); *H01G 4/30* (2013.01); *H05K 3/3442* (2013.01); *H05K 3/403* (2013.01); *H05K 2201/049* (2013.01); *H05K 2201/09181* (2013.01);
(Continued)

(58) Field of Classification Search
CPC ... H05K 1/02; H05K 1/11; H05K 1/18; H05K 1/181; H05K 3/32; H05K 3/34; H05K 3/36; H01G 4/01; H01G 4/12; H01G 4/30; H01G 4/35; H01G 4/228; H03B 5/00; H03B 5/32; H03B 5/36
USPC ...... 174/255, 250, 257–260; 361/306.1, 309, 361/303, 728, 782; 29/739, 840
See application file for complete search history.

(56) References Cited

U.S. PATENT DOCUMENTS 6,209,196 B1 * 4/2001 Ozono ................. H01L 21/563
257/E21.503
6,310,759 B2 * 10/2001 Ishigaki ................. H05K 3/34
361/309

(Continued)

FOREIGN PATENT DOCUMENTS

JP    2004-134430 A    4/2004
JP    2012-204572 A    10/2012
(Continued)

*Primary Examiner* — Xiaoliang Chen
(74) *Attorney, Agent, or Firm* — Keating & Bennett, LLP

(57) ABSTRACT

An electronic component includes an electronic element including outer electrodes on a surface, a substrate terminal on which the electronic element is mounted, and a conductor that covers at least a portion of the substrate terminal. The substrate terminal includes a first main surface, a second main surface at a side opposite to the first main surface, and a side surface connecting the first main surface and the second main surface. The substrate terminal includes a mounting electrode that is provided on the first main surface and is electrically connected to the outer electrodes of the electronic element. The mounting electrode includes adjacent portions that are located to be adjacent to the side surface of the substrate terminal. The conductor covers at least a portion of the adjacent portion.

16 Claims, 29 Drawing Sheets

(51) Int. Cl.
*H05K 3/34* (2006.01)
*H05K 3/40* (2006.01)

(52) U.S. Cl.
CPC .............. *H05K 2201/10015* (2013.01); *H05K 2201/2045* (2013.01); *Y02P 70/613* (2015.11)

(56) References Cited

U.S. PATENT DOCUMENTS

| | | | | |
|---|---|---|---|---|
| 6,326,239 B1* | 12/2001 | Asai | ...................... | H01L 23/544 257/E21.511 |
| 6,917,510 B1* | 7/2005 | Prymak | .................. | H01G 2/065 361/309 |
| 2003/0056975 A1* | 3/2003 | Kochanowski | ........ | H05K 1/111 174/250 |
| 2004/0066589 A1* | 4/2004 | Togashi | ................. | H01G 2/065 361/15 |
| 2004/0203237 A1* | 10/2004 | Laffoley | ................ | H05K 1/141 438/689 |
| 2005/0056458 A1* | 3/2005 | Sugiura | ................... | H03B 5/36 174/260 |
| 2006/0011702 A1* | 1/2006 | Funaya | ................ | B23K 35/262 228/56.3 |
| 2008/0073768 A1* | 3/2008 | Shiraishi | ................. | B81B 7/007 257/684 |
| 2008/0239621 A1* | 10/2008 | Tajuddin | ................. | H01G 2/06 361/306.1 |
| 2008/0253102 A1* | 10/2008 | Kuroda | ................ | H05K 3/3442 361/803 |
| 2008/0316721 A1* | 12/2008 | Maki | .................... | H01L 23/498 361/760 |
| 2009/0168303 A1* | 7/2009 | Yoshida | ................ | H01G 9/012 361/523 |
| 2009/0242249 A1* | 10/2009 | Furusawa | ............ | B23K 35/264 174/259 |
| 2012/0200366 A1* | 8/2012 | Nishiyama | ............... | H03H 9/13 331/158 |
| 2012/0300361 A1* | 11/2012 | Togashi | ................... | H01G 4/30 361/301.4 |
| 2013/0033836 A1* | 2/2013 | Hattori | .................... | H01G 4/30 361/768 |
| 2013/0037911 A1* | 2/2013 | Hattori | ................... | H01L 28/40 257/532 |
| 2013/0233606 A1* | 9/2013 | Fujii | ........................ | H05K 1/16 174/260 |
| 2013/0284507 A1* | 10/2013 | Hattori | .................... | H05K 1/18 174/260 |
| 2013/0319741 A1* | 12/2013 | Ahn | ........................ | H01G 4/30 174/260 |
| 2013/0329389 A1* | 12/2013 | Hattori | ................ | H05K 1/0216 361/782 |
| 2014/0016242 A1* | 1/2014 | Hattori | .................... | H01G 2/06 361/303 |
| 2014/0020942 A1* | 1/2014 | Cho | ........................ | H01G 4/30 174/260 |
| 2014/0041914 A1* | 2/2014 | Hattori | ................... | H05K 1/181 174/260 |
| 2014/0083755 A1* | 3/2014 | Lee | ........................ | H05K 1/181 174/260 |
| 2014/0110161 A1* | 4/2014 | Hattori | ................... | H05K 1/111 174/260 |
| 2014/0116768 A1* | 5/2014 | Hattori | ................... | H01G 2/065 174/260 |
| 2014/0124256 A1* | 5/2014 | Hattori | ................... | H01G 2/065 174/260 |
| 2014/0131082 A1* | 5/2014 | Ahn | ...................... | H05K 3/3442 174/260 |
| 2014/0131853 A1* | 5/2014 | Takemura | ............ | H03H 9/0542 257/734 |
| 2014/0144688 A1* | 5/2014 | Choi | ...................... | H05K 1/111 174/260 |
| 2014/0151102 A1* | 6/2014 | Lee | ........................ | H01G 2/065 174/260 |
| 2014/0153155 A1* | 6/2014 | Fujii | ...................... | H01G 4/302 361/301.4 |
| 2014/0166351 A1* | 6/2014 | Lee | ......................... | H01G 2/06 174/258 |
| 2014/0168851 A1* | 6/2014 | Lee | ......................... | H01G 4/30 361/303 |
| 2014/0177129 A1* | 6/2014 | Lee | ...................... | H01G 4/0085 361/301.4 |
| 2014/0268486 A1* | 9/2014 | Hattori | ................... | H01G 4/308 361/301.4 |
| 2014/0268487 A1* | 9/2014 | Yoshida | ................. | H01G 2/065 361/301.4 |
| 2014/0268488 A1* | 9/2014 | Hattori | ................... | H01G 4/30 361/301.4 |
| 2014/0268587 A1* | 9/2014 | Nomura | ................. | H05K 3/284 361/728 |
| 2014/0284089 A1* | 9/2014 | Hattori | ................... | H01K 1/141 174/258 |
| 2015/0041195 A1* | 2/2015 | Ahn | ...................... | H01G 2/065 174/260 |
| 2015/0122534 A1* | 5/2015 | Park | ...................... | H01G 2/065 174/260 |
| 2015/0131252 A1* | 5/2015 | Park | ...................... | H05K 1/181 361/782 |
| 2016/0007446 A1* | 1/2016 | Ishikawa | ................ | H05K 1/113 174/260 |

FOREIGN PATENT DOCUMENTS

| | | |
|---|---|---|
| JP | 2012-212943 A | 11/2012 |
| JP | 2012-212944 A | 11/2012 |
| JP | 2013-038144 A | 2/2013 |
| JP | 2013-038291 A | 2/2013 |
| JP | 2013-258240 A | 12/2013 |
| JP | 2014-057046 A | 3/2014 |
| JP | 5459444 B2 | 4/2014 |
| JP | 5459445 B2 | 4/2014 |
| WO | 2012/090986 A1 | 7/2012 |

\* cited by examiner

ELECTRONIC COMPONENT

BACKGROUND OF THE INVENTION

1. Field of the Invention

The present invention relates to an electronic component, and in particular, relates to an electronic component including an electronic element including an electrostrictive property.

2. Description of the Related Art

Japanese Unexamined Patent Application Publication No. 2004-134430 discloses an electronic component that suppresses propagation of vibration so as to try to reduce generation of noise. In the electronic component as described in Japanese Unexamined Patent Application Publication No. 2004-134430, one interposer substrate is arranged at the lower side of a capacitor element as a main body portion of a multilayer capacitor. A pair of mounting electrodes that are connected to a pair of outer electrodes of the capacitor element, respectively, are arranged at the surface side of the interposer substrate. A pair of connection electrodes each of which is connected to a wiring pattern on the interposer substrate by solder are arranged at the rear surface side of the interposer substrate.

When the electronic component is mounted on a circuit substrate by connecting the electronic element and the circuit substrate with a substrate terminal interposed therebetween, failures in mounting of the electronic component occur due to electrode burrs on the substrate terminal in some cases.

SUMMARY OF THE INVENTION

Accordingly, preferred embodiments of the present invention provide an electronic component that significantly reduces or prevents failures in mounting of the electronic component due to electrode burrs on a substrate terminal.

According to a preferred embodiment of the present invention, an electronic component includes an electronic element including an outer electrode on a surface, a substrate terminal on which the electronic element is mounted, and a conductor that covers a portion of the substrate terminal. The substrate terminal includes a first main surface, a second main surface opposite to the first main surface, and a side surface connecting the first main surface and the second main surface. The substrate terminal includes a mounting electrode on the first main surface electrically connected to the outer electrode of the electronic element. The mounting electrode includes an adjacent portion that is adjacent to the peripheral surface of the substrate terminal. The conductor covers at least a portion of the adjacent portion.

According to another preferred embodiment of the present invention, the conductor covers an entirety of the adjacent portion.

According to still another preferred embodiment of the present invention, the adjacent portion is covered by the electronic element when seen from a height direction perpendicular or substantially perpendicular to the first main surface.

According to still another preferred embodiment of the present invention, the substrate terminal has a rectangular or substantially rectangular outer shape when seen from a height direction perpendicular or substantially perpendicular to the first main surface. The peripheral surface of the substrate terminal includes first and second side surfaces opposite to each other and third and fourth side surfaces connecting the first and second side surfaces opposite to each other.

According to still another preferred embodiment of the present invention, a maximum width of the substrate terminal is smaller than a maximum width of the electronic element in a direction perpendicular or substantially perpendicular to the first and second side surfaces.

According to still another preferred embodiment of the present invention, a maximum length of the substrate terminal is smaller than a maximum length of the electronic element in a direction perpendicular or substantially perpendicular to the third and fourth side surfaces.

According to still another preferred embodiment of the present invention, an entirety of the substrate terminal is covered by the electronic element when seen from a height direction perpendicular or substantially perpendicular to the first main surface.

According to still another preferred embodiment of the present invention, the mounting electrode includes two adjacent portions that are adjacent to the first and second side surfaces, respectively.

According to still another preferred embodiment of the present invention, the mounting electrode is spaced apart from the third and fourth side surfaces when seen from a height direction perpendicular or substantially perpendicular to the first main surface.

According to still another preferred embodiment of the present invention, a maximum length of the adjacent portion is smaller than a maximum length of the mounting electrode in a direction perpendicular or substantially perpendicular the third and fourth side surfaces.

According to still another preferred embodiment of the present invention, the conductor is solder and electrically connects the outer electrode and the mounting electrode.

According to still another preferred embodiment of the present invention, the adjacent portion includes a burr of the mounting electrode. The conductor fixes the burr.

According to various preferred embodiments of the present invention, mounting failures of the electronic component due to the electrode burrs on the substrate terminal are significantly reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
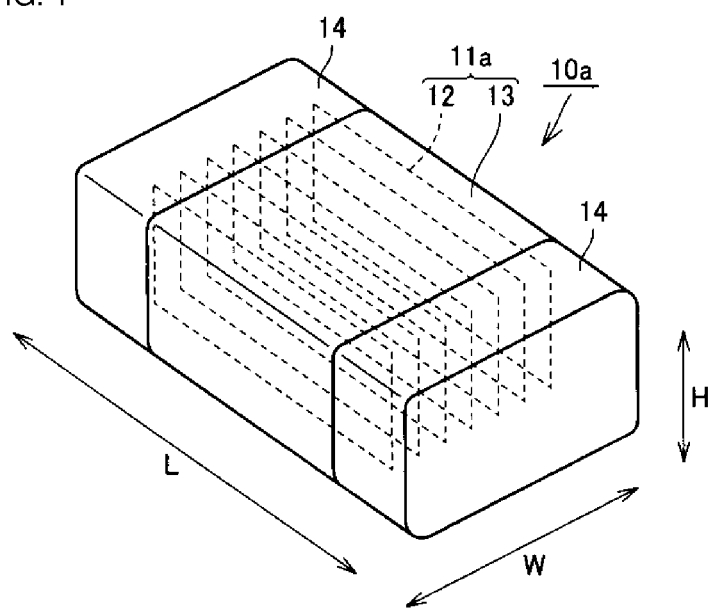
FIG. 1 is a perspective view illustrating a first structure of a capacitor element included in an electronic component according to a first preferred embodiment of the present invention.

Hereinafter, electronic components according to preferred embodiments of the present invention will be described with reference to the drawings. In the following description of the preferred embodiments, the same reference numerals denote the same or corresponding portions in the drawings and explanation thereof is not repeated.

First Preferred Embodiment

First, a capacitor element as an example of an electronic element included in an electronic component according to a first preferred embodiment of the present invention will be described. The electronic element is not limited to the capacitor element and may be an inductor element, a thermistor element, a piezoelectric element, a semiconductor element, or the like.

Figure 2:
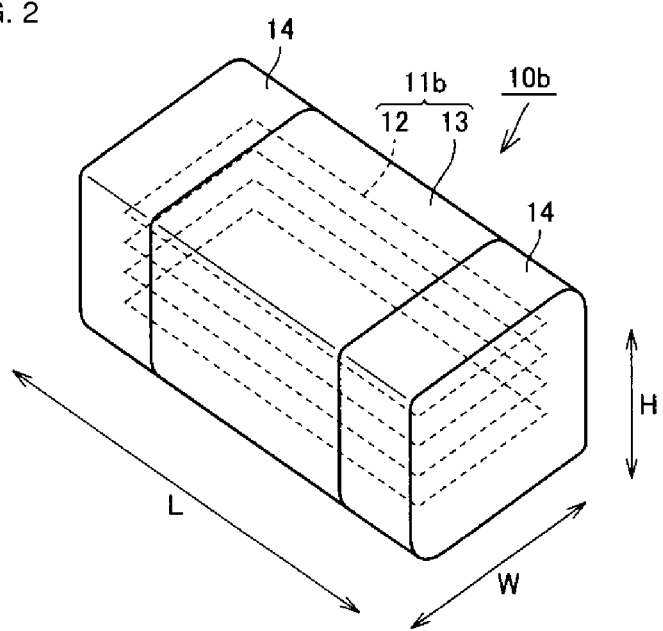
FIG. 2 is a perspective view illustrating a second structure of the capacitor element included in the electronic component according to the first preferred embodiment of the present invention.

FIG. 1 is a perspective view illustrating a first structure of the capacitor element included in the electronic component according to the first preferred embodiment of the present invention. FIG. 2 is a perspective view illustrating a second structure of the capacitor element included in the electronic component according to the first preferred embodiment of the present invention. In FIGS. 1 and 2, a lengthwise direction L of the capacitor element, a width direction W of the capacitor element, and a height direction H of the capacitor element are illustrated.

As illustrated in FIG. 1, a capacitor element 10a having the first structure, which is included in the electronic component according to the first preferred embodiment of the present invention, includes a multilayer body 11a having a rectangular or substantially rectangular parallelepiped shape and outer electrodes 14. Dielectric layers 13 and flat plate-shaped inner electrodes 12 are alternately laminated in the multilayer body 11a. The outer electrodes 14 are provided on the multilayer body 11a and are located on surfaces at both ends of the capacitor element 10a in the lengthwise direction L.

First inner electrodes 12 of the adjacent inner electrodes 12 opposing each other are electrically connected to the outer electrode 14 located at one end of the capacitor element 10a in the lengthwise direction L. Second inner electrodes 12 thereof are electrically connected to the outer electrode 14 located at the other end of the capacitor element 10a in the lengthwise direction L.

In the capacitor element 10a having the first structure, the lamination direction of the dielectric layers 13 and the inner electrodes 12 is perpendicular or substantially perpendicular to the lengthwise direction L of the capacitor element 10a and the height direction H of the capacitor element 10a. That is to say, the lamination direction of the dielectric layers 13 and the inner electrodes 12 is parallel with the width direction W of the capacitor element 10a.

As illustrated in FIG. 2, a capacitor element 10b having the second structure included in the electronic component according to the first preferred embodiment of the present invention includes a multilayer body 11b having a rectangular or substantially rectangular parallelepiped shape and the outer electrodes 14. The dielectric layers 13 and the flat plate-shaped inner electrodes 12 are alternately laminated in the multilayer body 11b. The outer electrodes 14 are provided on the multilayer body 11b and are located on surfaces at both ends of the capacitor element 10b in the lengthwise direction L.

First inner electrodes 12 of the adjacent inner electrodes 12 opposing each other are electrically connected to the outer electrode 14 located at one end of the capacitor element 10b in the lengthwise direction L. Second inner electrodes 12 thereof are electrically connected to the outer electrode 14 located at the other end of the capacitor element 10b in the lengthwise direction L.

In the capacitor element 10b having the second structure, the lamination direction of the dielectric layers 13 and the inner electrodes 12 is perpendicular or substantially perpendicular to the lengthwise direction L of the capacitor element 10b and the width direction W of the capacitor element 10b. That is to say, the lamination direction of the dielectric layers 13 and the inner electrodes 12 is parallel or substantially parallel with the height direction H of the capacitor element 10b.

In the present preferred embodiment, the dielectric layers 13 preferably are defined by ceramic sheets mainly containing barium titanate. It should be noted that the main component forming the dielectric layers 13 is not limited to barium titanate and may be a ceramic material having a high dielectric constant such as calcium titanate and strontium titanate. The dielectric layers 13 may contain a sub-component of at least one type, such as Mn compound, Fe compound, Cr compound, Co compound, and Ni compound. Further, the dielectric layer 13 may contain Si, a glass component, and the like.

As the capacitor element 10a or 10b, a capacitor element having an electrostatic capacitance of equal to or higher than about 1 µF, a capacitor element having a relative dielectric constant of equal to or higher than about 3000, a capacitor element having equal to or more than about 350 inner electrodes 12, a capacitor element in which the thickness of one dielectric layer 13 is equal to or smaller than about 1 µm, or the like can be preferably used, for example.

The inner electrodes 12 are formed preferably by printing pastes containing Ni on the ceramic sheets forming the dielectric layers 13. It should be noted that the main material of the inner electrodes 12 is not limited to Ni and may be alloy of Pd and Ag.

The outer electrodes 14 are formed preferably by baking conductive pastes on the multilayer body 11a or 11b or performing plating on the multilayer body 11a or 11b. The outer electrodes 14 have a multilayer structure in which metal films made of Ni, Sn, and the like are laminated sequentially.

In the present preferred embodiment, the outer electrodes 14 are preferably provided on five surfaces at each of both ends of the capacitor element 10a or 10b in the lengthwise direction L. It is, however, sufficient that the outer electrodes are provided on at least surfaces at the side opposing a substrate terminal, which will be described later, in the capacitor element 10a or 10b. In terms of mounting stability of the capacitor element 10a or 10b, the outer electrodes 14 are preferably provided over the third and fourth side surfaces of the capacitor element 10a or 10b in the lengthwise direction L.

Hereinafter, the electronic component according to the present preferred embodiment will be described.

Figure 3:
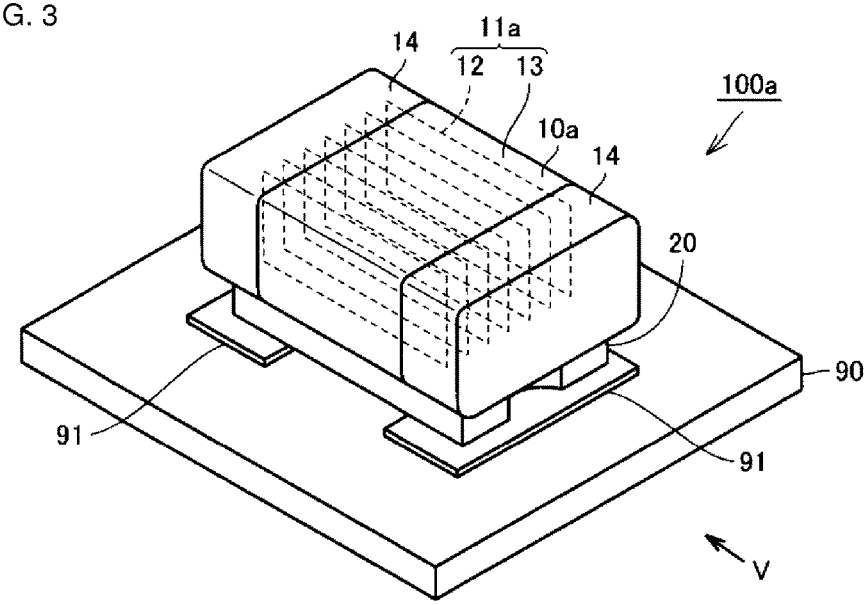
FIG. 3 is a perspective view illustrating a state where the electronic component according to the first preferred embodiment of the present invention including the capacitor element having the first structure as an electronic element is mounted on a circuit substrate.
Figure 4:
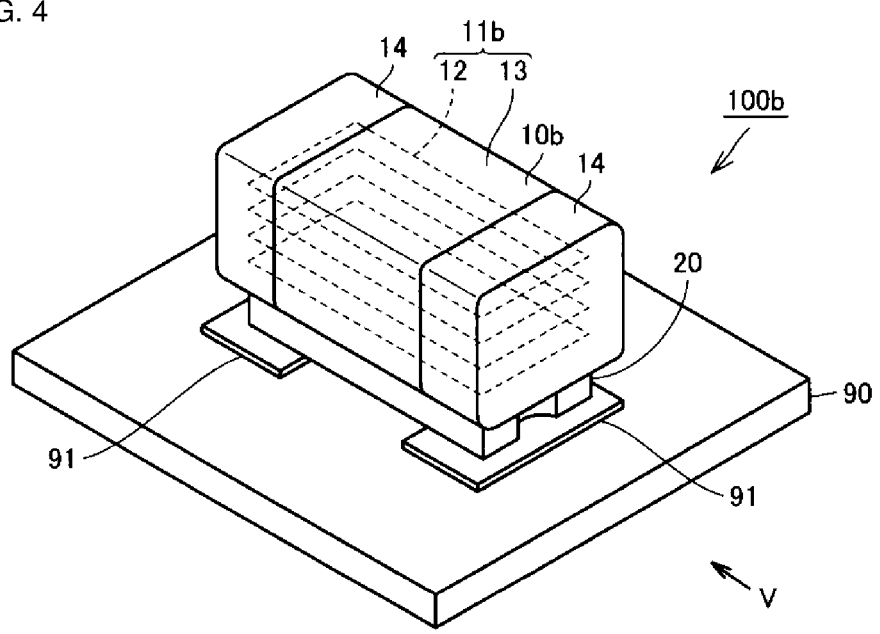
FIG. 4 is a perspective view illustrating a state where the electronic component according to the first preferred embodiment of the present invention including the capacitor element having the second structure as the electronic element is mounted on the circuit substrate.
Figure 5:
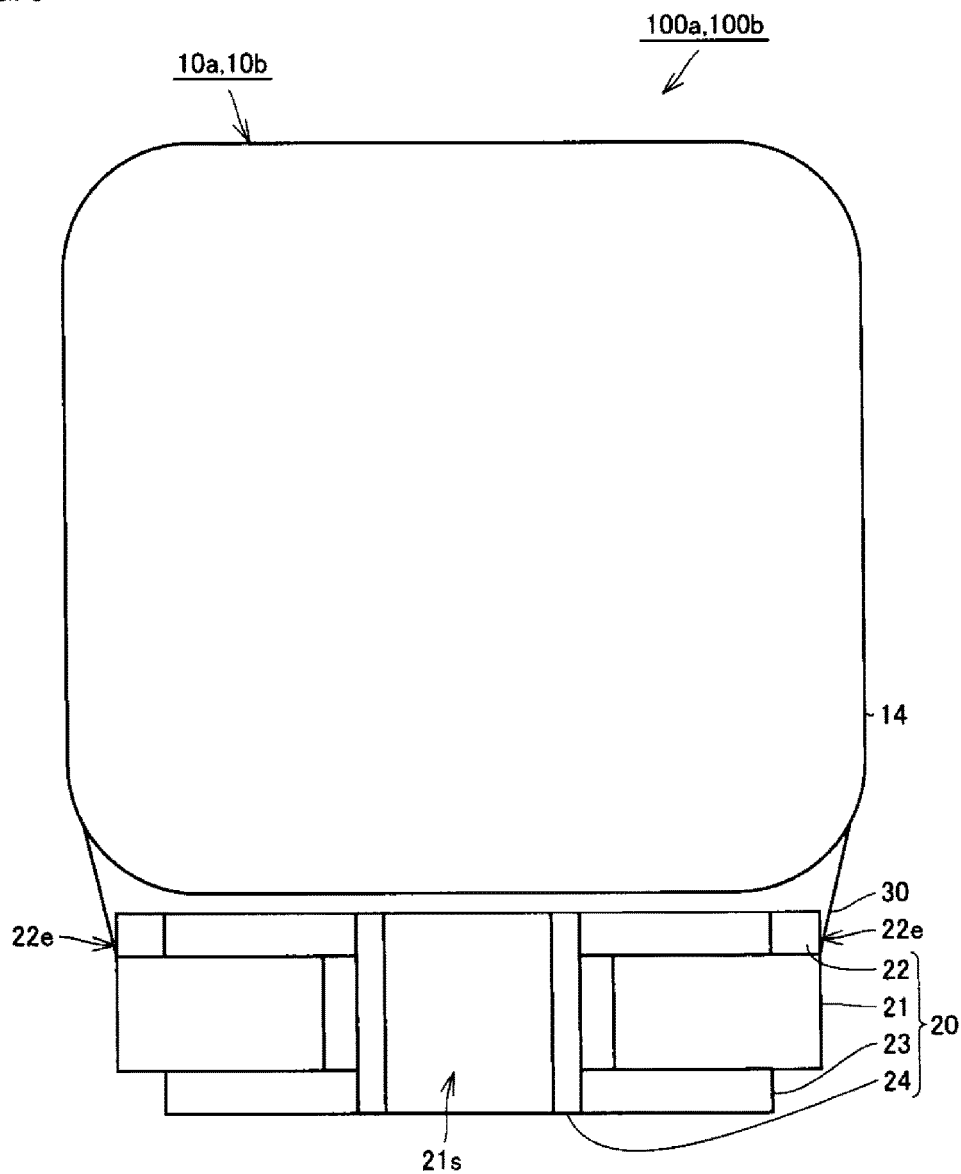
FIG. 5 is a view illustrating the electronic component as illustrated in FIG. 3 or 4 when seen from the direction of an arrow V.
Figure 6:
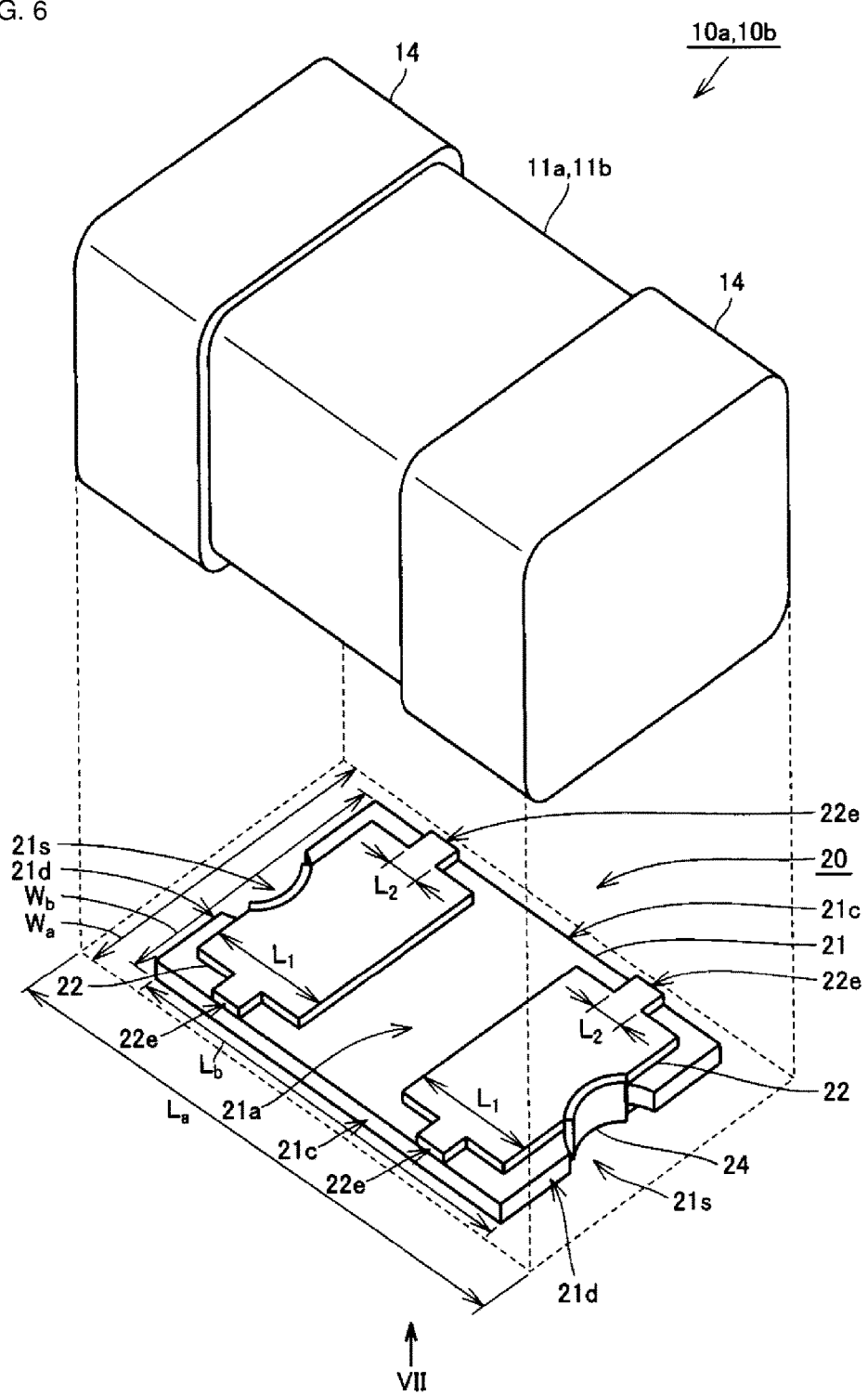
FIG. 6 is an exploded perspective view illustrating the electronic component according to the first preferred embodiment of the present invention.
Figure 7:
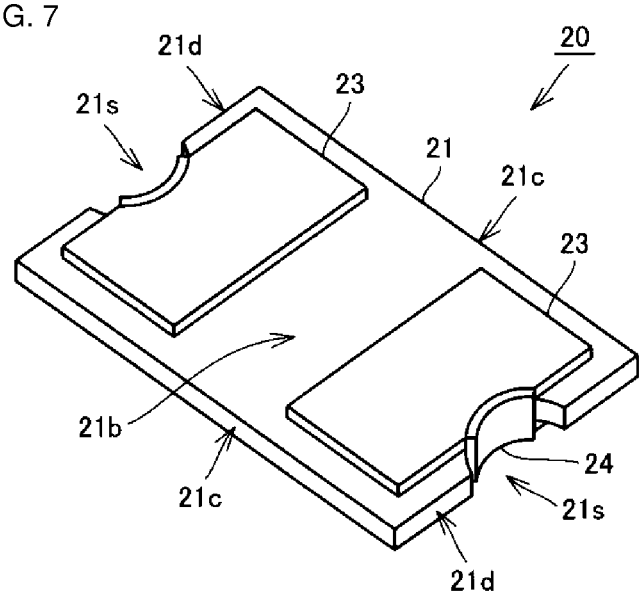
FIG. 7 is a view illustrating a substrate terminal included in the electronic component in FIG. 6 when seen from the direction of an arrow VII.

FIG. 3 is a perspective view illustrating a state where the electronic component according to the present preferred embodiment including the capacitor element having the first structure as the electronic element is mounted on a circuit substrate. FIG. 4 is a perspective view illustrating a state where the electronic component according to the present preferred embodiment including the capacitor element having the second structure as the electronic element is mounted on the circuit substrate. FIG. 5 is a view illustrating the electronic component as illustrated in FIG. 3 or 4 when seen from the direction of an arrow V. FIG. 6 is an exploded perspective view illustrating the electronic component according to the present preferred embodiment. FIG. 7 is a view illustrating a substrate terminal included in the electronic component in FIG. 6 when seen from the direction of an arrow VII. In FIG. 6, a conductor included in the electronic component is not illustrated.

As illustrated in FIGS. 3 to 7, an electronic component 100a or 100b according to the present preferred embodiment includes the capacitor element 10a or 10b including the outer electrodes 14 on the surfaces thereof, a substrate terminal 20 on which the capacitor element 10a or 10b is mounted, and a conductor 30 covering a portion of the substrate terminal 20.

As illustrated in FIGS. 3 and 4, a circuit substrate 90 includes lands 91 on the surface thereof. The lands 91 are connected to connection electrodes 23, which will be described later, of the substrate terminal 20.

As illustrated in FIGS. 5 to 7, the substrate terminal 20 included in the electronic component 100a or 100b according to the present preferred embodiment includes an insulating substrate 21. In the present preferred embodiment, the insulating substrate 21 has a rectangular or substantially rectangular outer shape when seen from a height direction H perpendicular or substantially perpendicular to a first main surface 21a. Note that the outer shape of the insulating substrate 21 is not limited to the rectangular or substantially rectangular shape and may be an elliptical or substantially elliptical shape or the like, for example. The corners and ridge line portions of the insulating substrate 21 may be chamfered.

The insulating substrate 21 includes a first main surface 21a at the side at which the capacitor element 10a or 10b is mounted, a second main surface 21b at the side opposite to the first main surface 21a, and a peripheral surface connecting the first main surface 21a and the second main surface 21b. The peripheral surface of the insulating substrate 21 includes first and second side surfaces 21c located at the sides opposite to each other and third and fourth side surfaces 21d connecting the first and second side surfaces 21c and located at the sides opposite to each other.

A resin material such as epoxy resin or a ceramic material such as alumina can be used as a material of the insulating substrate 21. Further, filler made of an inorganic material or an organic material or a woven fabric may be added to the insulating substrate 21. In the present preferred embodiment, a glass epoxy substrate formed by adding a glass woven fabric to a base body made of epoxy resin is preferably used as the insulating substrate 21.

In consideration of suppression of propagation of vibration, the thickness of the insulating substrate 21 is preferably equal to or larger than about 0.05 mm and equal to or smaller than about 0.4 mm, for example. To be specific, in order to suppress propagation of vibration, the rigidity of the insulating substrate 21 is preferably low. Therefore, the thickness of the insulating substrate 21 is preferably equal to or smaller than about 0.4 mm, for example.

On the other hand, when the insulating substrate 21 is too thin, solder to bond the electronic component 100a or 100b and the lands 91 of the circuit substrate 90 wets up and reaches the capacitor element 10a or 10b. Due to this, fillets are formed on the third and fourth side surfaces 21d of the capacitor element 10a or 10b in the lengthwise direction L in some cases. In this case, vibration propagates to the circuit substrate 90 from the capacitor element 10a or 10b through the fillets and it is not preferable. Therefore, in consideration of suppression of wetting-up of the solder, the thickness of the insulating substrate 21 is preferably equal to or larger than about 0.05 mm, for example.

As illustrated in FIG. 6, a maximum width $W_b$ of the substrate terminal 20 is smaller than a maximum width $W_a$ of the capacitor element 10a or 10b in the width direction of the insulating substrate 21, which is the direction perpendicular or substantially perpendicular to the first and second side surfaces 21c. A maximum length $L_b$ of the substrate terminal 20 is smaller than a maximum length $L_a$ of the capacitor element 10a or 10b in the lengthwise direction of the insulating substrate 21, which is the direction perpendicular or substantially perpendicular to third and fourth side surfaces 21d.

As illustrated in FIGS. 3, 4, and 6, in the present preferred embodiment, the capacitor element 10a or 10b preferably covers an entirety of the substrate terminal 20 when seen from the above (the height direction H perpendicular or substantially perpendicular to the first main surface 21a). Therefore, as will be described later, when the conductor 30 is formed by solder to bond the outer electrodes 14 and mounting electrodes 22, adjacent portions 22e, which will be described later, are covered by the conductor 30 easily.

In terms of the mounting stability of the capacitor element 10a or 10b, a minimum length of the insulating substrate 21 is preferably equal to or more than about 0.8 times the maximum length of the capacitor element 10a or 10b, more preferably equal to or more than about 0.9 times, for example. A minimum width of the insulating substrate 21 is preferably equal to or more than about 0.8 times the maximum width of the capacitor element 10a or 10b, more preferably equal to or more than about 0.9 times, for example.

As illustrated in FIGS. 6 and 7, in the present preferred embodiment, cutouts 21s each having a half-oval, substantially half-oval, half-ellipsoid or substantially half-ellipsoid shape when seen from the above are provided on both the ends of the insulating substrate 21 in the lengthwise direction. It should be noted that the shape of each cutout 21s when seen from the above is not limited to the half-oval, substantially half-oval, half-ellipsoid or substantially half-ellipsoid shape and may be a polygonal shape.

The solder to bond the electronic component 100a or 100b and the lands 91 of the circuit substrate 90 can be held in spaces defined by the cutouts 21s by providing the cutouts 21s. This prevents the wetting-up of the solder to the third and fourth side surfaces of the capacitor element 10a or 10b in the lengthwise direction L. Note that the cutouts 21s may not be necessarily provided.

As illustrated in FIGS. 5 and 6, the substrate terminal 20 includes the mounting electrodes 22 that are provided on the first main surface 21a and are electrically connected to the outer electrodes 14 of the capacitor element 10a or 10b. To be specific, the two mounting electrodes 22 are arranged with an interval interposed therebetween in the lengthwise direction of the insulating substrate 21.

The mounting electrodes 22 include the adjacent portions 22e located to be adjacent to the peripheral surface of the substrate terminal 20. The adjacent portions 22e are adjacent to the peripheral surface of the substrate terminal 20 in at least any of the lengthwise direction of the insulating substrate 21, the width direction of the insulating substrate 21, and the height direction of the insulating substrate 21.

As illustrated in FIG. 6, in the present preferred embodiment, the adjacent portions 22e are covered by the capacitor element 10a or 10b when seen from the above. Each of the mounting electrodes 22 includes the two adjacent portions 22e which are adjacent to the first and second side surfaces 21c of the insulating substrate 21, respectively. Further, the mounting electrodes 22 are spaced apart from the third and fourth side surfaces 21d of the insulating substrate 21 when seen from the above.

A maximum length $L_2$ of each adjacent portion 22e is smaller than a maximum length $L_1$ of each mounting electrode 22 in the lengthwise direction of the insulating substrate 21. That is to say, each mounting electrode 22 is configured such that the length of the mounting electrode 22 in the lengthwise direction of the insulating substrate 21 is smaller on the adjacent portions 22e than other portions.

As illustrated in FIGS. 3, 4, 5, and 7, the substrate terminal 20 includes the connection electrodes 23 that are provided on the second main surface 21b and are electrically connected to the lands 91 of the circuit substrate 90. To be specific, the two connection electrodes 23 are arranged with an interval interposed therebetween in the lengthwise direction of the insulating substrate 21. In the present preferred embodiment, the connection electrodes 23 include no adjacent portion.

The substrate terminal 20 includes through-electrodes 24 that electrically connect the mounting electrodes 22 and the connection electrodes 23. As illustrated in FIGS. 5, 6, and 7, in the present preferred embodiment, the through-electrodes 24 are provided on the wall surfaces of the cutouts 21s.

In the present preferred embodiment, the conductor 30 is preferably defined by the solder and electrically connects the outer electrodes 14 and the mounting electrodes 22. Note that the conductor 30 is not limited to being defined by the solder and may be a conductive adhesive. Further, the conductor 30 may not necessarily electrically connect the outer electrodes 14 and the mounting electrodes 22. In this case, another conductor different from the conductor 30 is provided in order to electrically connect the outer electrodes 14 and the mounting electrodes 22.

As illustrated in FIG. 5, the conductor 30 covers at least a portion of the adjacent portions 22e. Preferably, the conductor 30 covers an entirety of the adjacent portions 22e.

Figure 29A:
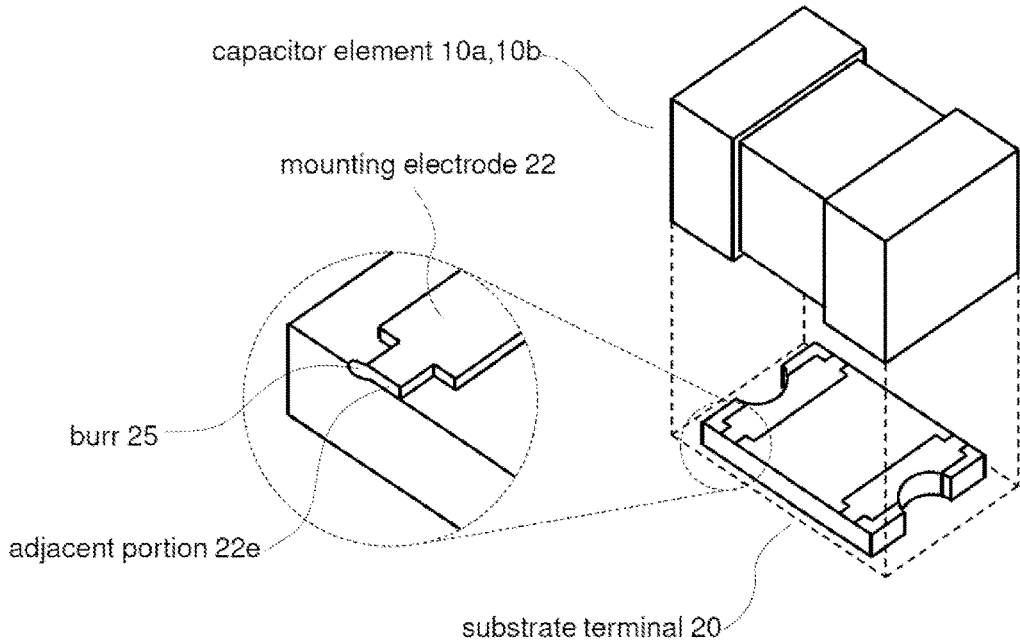
FIG. 29A is an exploded perspective view illustrating an electronic component according to a preferred embodiment of the present invention.
Figure 29B:
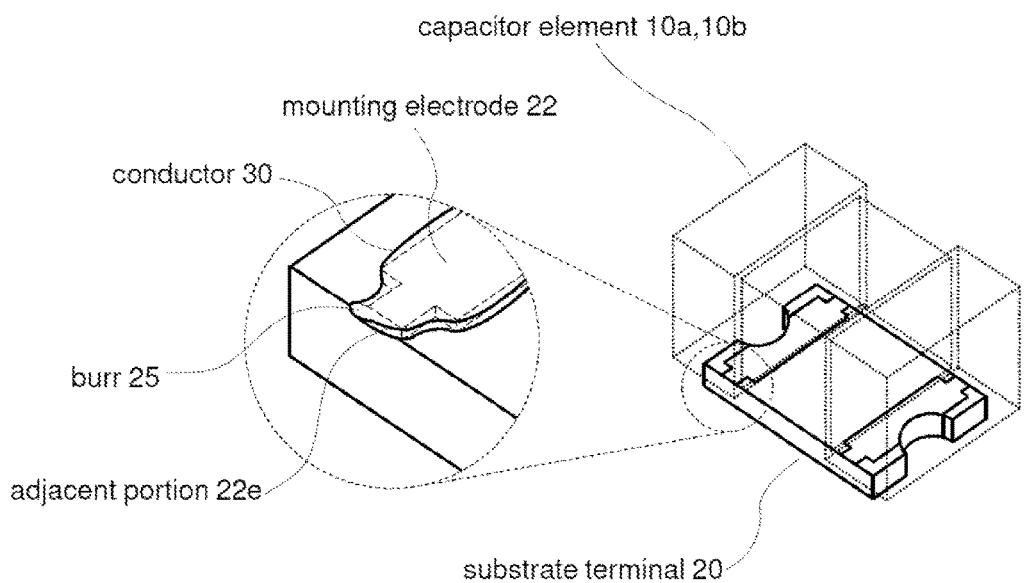
FIG. 29B is a perspective view illustrating a state where an electronic component according to a preferred emodiment of the present invention including a capacitor element is mounted on a circuit substrate.

As will be described later, and as shown in FIGS. 29A and 29B, the adjacent portions 22e contain burrs 25 of the mounting electrodes 22 in some cases. The conductor 30 fixes the burrs 25 of the mounting electrodes 22. It is sufficient that the conductor 30 fixes at least a portion of the burrs 25 of the mounting electrodes 22.

The connection electrodes 23 of the substrate terminal 20 and the lands 91 of the circuit substrate 90 are physically and electrically connected by an adhesive such as the solder, so that the electronic component 100a or 100b is mounted on the circuit substrate 90 as illustrated in FIGS. 3 and 4. With this, the capacitor element 10a or 10b and the circuit substrate 90 are connected with the substrate terminal 20 interposed therebetween.

The electronic component 100a or 100b is mounted on the circuit substrate 90 as described above, so that vibration generated on the capacitor element 10a or 10b attenuates when it propagates through the substrate terminal 20. Therefore, audible sound that is generated by propagation of the vibration to the circuit substrate 90 is significantly reduced.

Hereinafter, a method for manufacturing the electronic component according to the present preferred embodiment will be described. First, a non-limiting example of a method for manufacturing the substrate terminal 20 included in the electronic component 100a or 100b according to the present preferred embodiment will be described.

Figure 8:
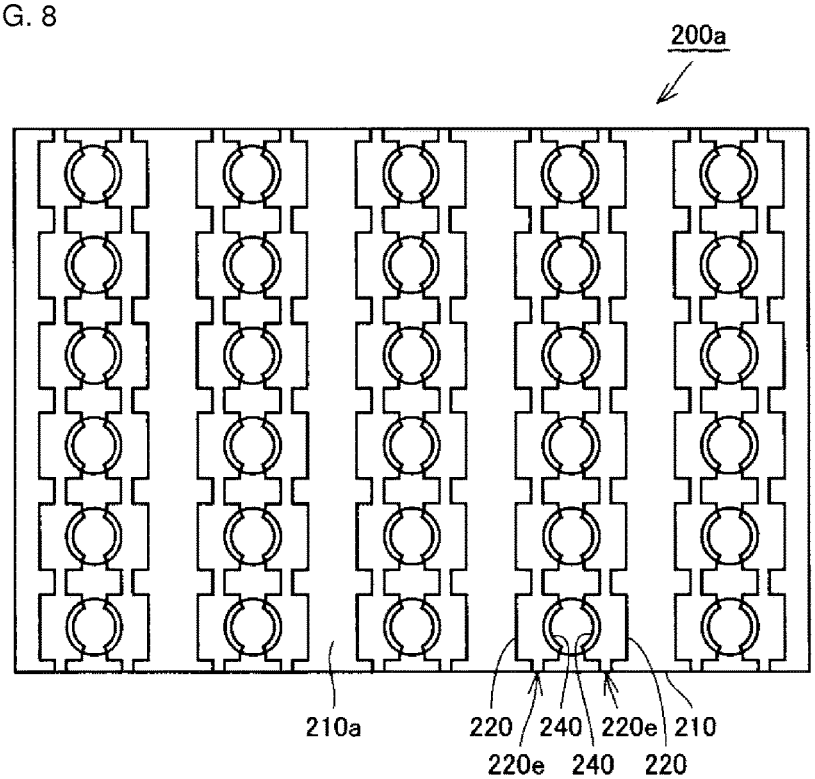
FIG. 8 is a view illustrating a mother substrate as a base of the substrate terminal included in the electronic component according to the first preferred embodiment of the present invention when seen from the first main surface side.
Figure 9:
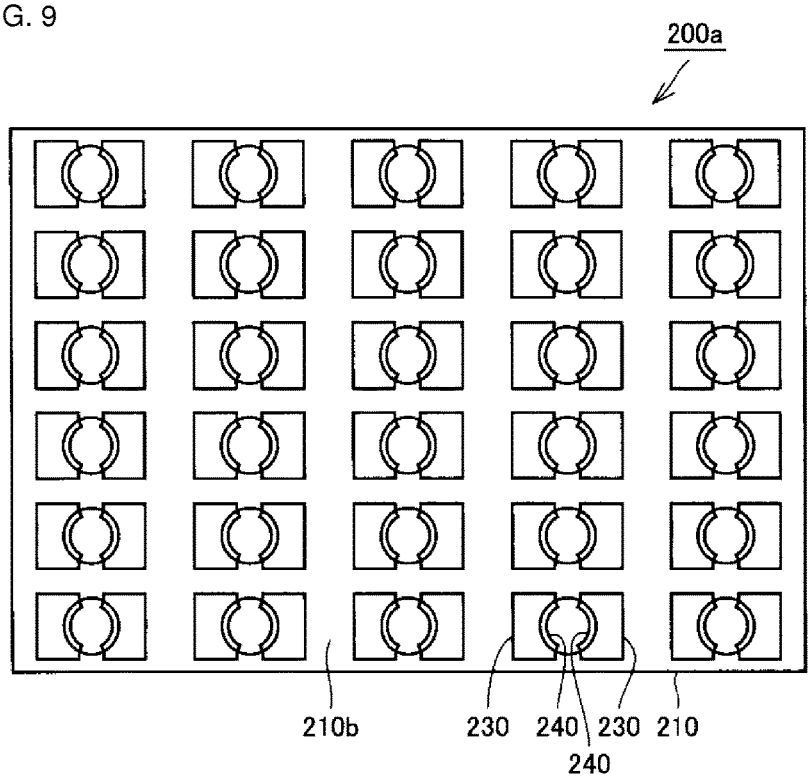
FIG. 9 is a view illustrating the mother substrate as the base of the substrate terminal included in the electronic component according to the first preferred embodiment of the present invention when seen from the second main surface side.

FIG. 8 is a view illustrating a mother substrate as a base of the substrate terminal included in the electronic component according to the present preferred embodiment when seen from the first main surface side. FIG. 9 is a view illustrating the mother substrate as the base of the substrate terminal included in the electronic component according to the present preferred embodiment when seen from the second main surface side.

First, as illustrated in FIGS. 8 and 9, a mother substrate 200a on which wiring patterns are formed on both of a first main surface 210a and a second main surface 210b is prepared. For example, the mother substrate 200a is preferably manufactured in the following manner.

Via holes 240 are formed on a double-sided copper clad laminated plate including an insulating substrate 210 having a rectangular shape when seen from the above, which is available in the market for a printed circuit board. With this, electrodes 220 on the first main surface 210a and electrodes 230 on the second main surface 210b are conducted to each other. Subsequently, the wiring patterns are formed on both of the first main surface 210a and the second main surface 210b by etching processing or the like.

In the present preferred embodiment, electroplating is performed in a subsequent process. Therefore, at least the wiring pattern on the first main surface 210a has a shape that the plurality of electrodes 220 are coupled by coupling portions 220e. As illustrated in FIG. 8, in the present preferred embodiment, the coupling portions 220e extend in a straight-line form in the width direction of the mother substrate 200a. The width direction of the mother substrate 200a corresponds to the width direction of the substrate terminal 20 and the lengthwise direction of the mother substrate 200a corresponds to the lengthwise direction of the substrate terminal 20.

The length of each coupling portion 220e in the lengthwise direction of the mother substrate 200a is preferably equal to or larger than about 0.10 mm in terms of conduction in the electroplating, for example.

The wiring pattern on the second main surface 210b has a shape that the individual electrodes 230 are aligned in a matrix form. As described above, the electrodes 230 are conducted to the electrodes 220 with the via holes 240. Therefore, electroplating can be also performed on the electrodes 230 arranged in the matrix form.

Thereafter, a Ni film is formed on the wiring pattern made of copper by electroplating and an Sn film is further formed on the Ni film by electroplating. When the electroplating is performed, a plating terminal is attached to one end of the mother substrate 200a in the width direction, so that a direct current flows through all the electrodes 220, the electrodes 230, and the via holes 240.

When the Sn film is formed on the wiring pattern made of copper by non-electrolytic plating, a whisker is easy to be generated due to stress between both the metals. When the whisker flies on the circuit substrate 90 on which the electronic component 100a or 100b is mounted, the circuit substrate 90 is short-circuited in some cases. For coping with this, in the present preferred embodiment, the electroplating is performed so as to reduce the whisker that is generated on the electrodes and prevent the occurrence of a short circuit of the circuit substrate 90.

In order to significantly reduce or prevent generation of the burrs, the thickness of the Ni film is equal to or larger than about 1 μm preferably, and equal to or larger than about 3 μm more preferably, for example. In terms of bonding property with the solder, the thickness of the Sn film preferably is equal to or larger than about 1 μm, for example.

Figure 10:
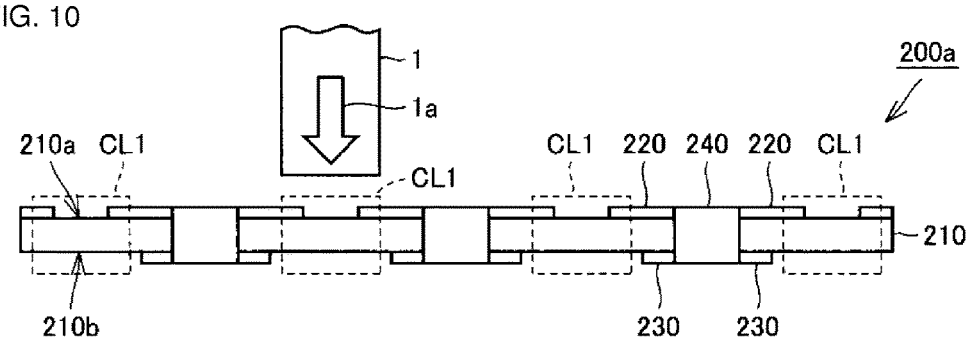
FIG. 10 is a cross-sectional view illustrating a state where the mother substrate is cut by dicing in the first preferred embodiment of the present invention.
Figure 11:
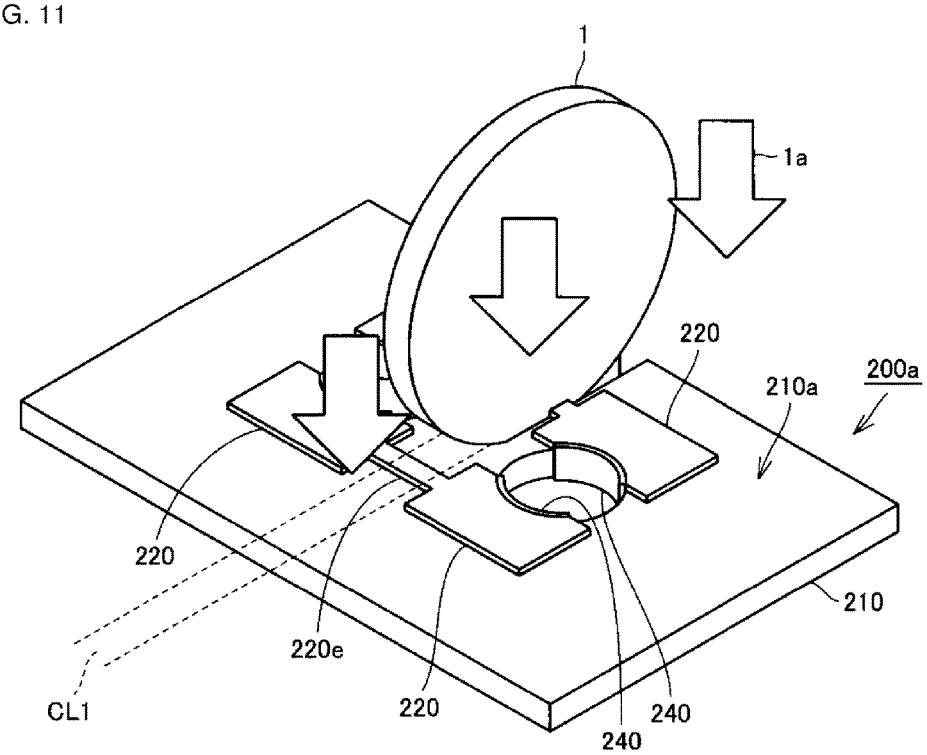
FIG. 11 is a perspective view illustrating a state where the mother substrate is cut by dicing in the first preferred embodiment of the present invention.
Figure 12:
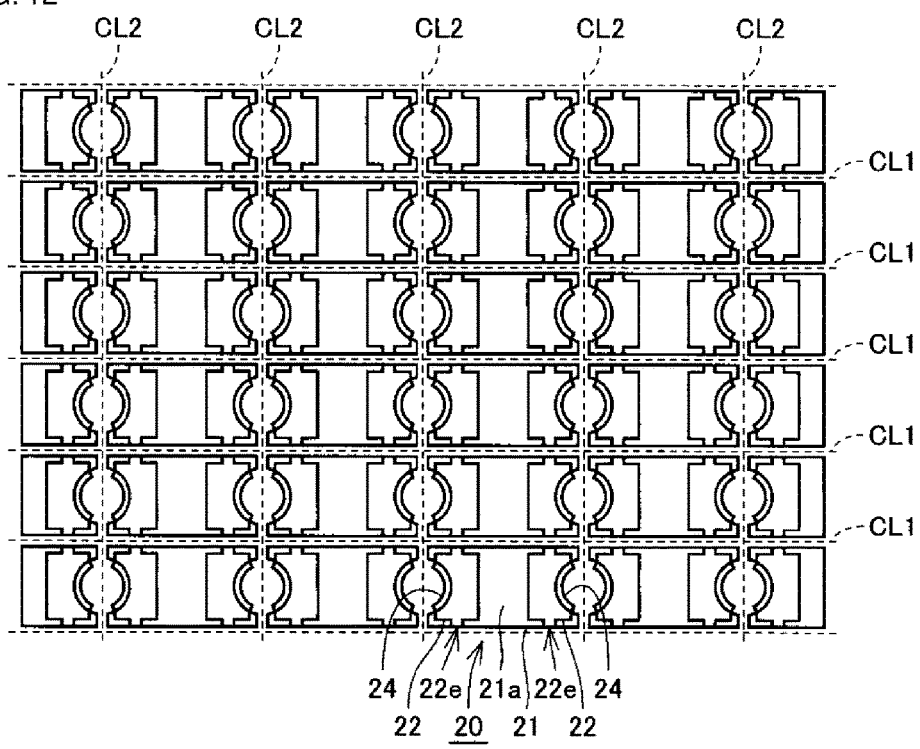
FIG. 12 is a view illustrating a cut mother substrate when seen from the first main surface side in the first preferred embodiment of the present invention.
Figure 13:
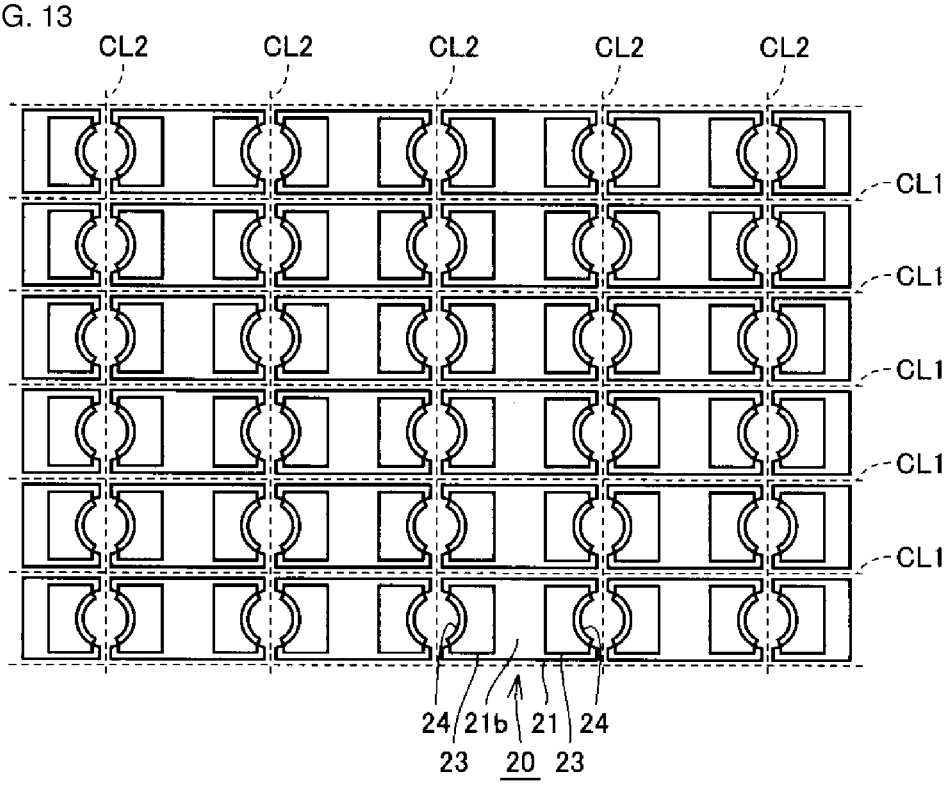
FIG. 13 is a view illustrating the cut mother substrate when seen from the second main surface side in the first preferred embodiment of the present invention.

The mother substrate 200a manufactured as described above is cut into the individual substrate terminals 20. FIG. 10 is a cross-sectional view illustrating a state where the mother substrate is cut by dicing in the present preferred embodiment. FIG. 11 is a perspective view illustrating a state where the mother substrate is cut by dicing in the present preferred embodiment. FIG. 12 is a view illustrating the cut mother substrate when seen from the first main surface side in the present preferred embodiment. FIG. 13 is a view illustrating the cut mother substrate when seen from the second main surface side in the present preferred embodiment.

As illustrated in FIGS. 10 and 11, the mother substrate 200a is cut from the first main surface 210a side by a dicing blade 1. Preferably, the dicing blade 1 is made close to the mother substrate 200a from the first main surface 210a side in the direction perpendicular or substantially perpendicular to the first main surface 210a as indicated by an arrow 1a so as to cut the mother substrate 200a.

As illustrated in FIGS. 10 to 13, the mother substrate 200a is cut along cut lines CL1 and CL2 as virtual lines, so that the mother substrate 200a is diced into the individual substrate terminals 20. The cut lines CL1 are virtual lines used to form the first and second side surfaces of the substrate terminals 20 and the cut lines CL2 are virtual lines used to form the third and fourth side surfaces of the substrate terminals 20.

The coupling portions 220e are located on the cut lines CL1 on the first main surface 210a of the mother substrate 200a. Therefore, the coupling portions 220e are cut by the dicing blade 1. The dicing blade 1 is made close to the mother substrate 200a to cut the mother substrate 200a as described above, so that generation of burrs on the cut portions of the coupling portions 220e is significantly reduced or prevented.

To be specific, when the coupling portions 220e are cut by the dicing blade 1, the insulating substrate 210 is located at the lower side of the coupling portions 220e. Therefore, extension of the cut portions of the coupling portions 220e by the dicing blade 1 is prevented by the insulating substrate 210. As a result, generation of burrs due to the extension of the cut portions of the coupling portions 220e is significantly reduced or prevented.

The cut portions of the coupling portions 220e correspond to the adjacent portions 22e. The electrodes 220 after the coupling portions 220e are cut correspond to the mounting electrodes 22. As a result of the electroplating as described above, each of the mounting electrodes 22 includes the two adjacent portions 22e that are adjacent to the first and second side surfaces 21c of the insulating substrate 21, respectively. The burrs on the cut portions of the coupling portions 220e are burrs of the mounting electrodes 22.

The electrodes 230 are not located on the cut lines CL1 on the second main surface 210b of the mother substrate 200a. Therefore, generation of burrs of the connection electrodes 23 is significantly reduced or prevented.

The through-electrodes are not located on the cut lines CL2 on the via holes 240 of the mother substrate 200a. Therefore, generation of burrs of the through-electrodes 24 is significantly reduced or prevented.

Solder pastes are applied to the mounting electrodes 22 of the substrate terminal 20 manufactured as described above. Then, the capacitor element 10a or 10b is placed on the substrate terminal 20 such that the solder pastes adhere to the outer electrodes 14 to be re-flowed. The solder pastes melt by reflow are solidified, so that the conductor 30 is formed. With this, the capacitor element 10a or 10b is mounted on the substrate terminal 20, and the electronic component 100a or 100b is manufactured.

The manufactured electronic component 100a or 100b is accommodated in a package with tape. In the package, a number of accommodation holes to accommodate the electronic components 100a or 100b one by one are formed in one row. When the electronic component 100a or 100b is mounted on the circuit substrate 90, the electronic component 100a or 100b is taken out of the package one by one and is mounted.

In the electronic component 100a or 100b according to the present preferred embodiment, generation of burrs of the mounting electrodes 22 is significantly reduced or prevented. In addition, the conductor 30 covers at least a portion of the adjacent portions 22e. With this, generation of failure in mounting of the electronic component 100a or 100b due to the burrs of the mounting electrodes 22 is significantly reduced or prevented.

To be specific, as shown in FIGS. 29A and 29B, the conductor 30 fixes at least a portion of the burrs 25 of the mounting electrodes 22, so that short-circuit of the circuit substrate 90 due to drop of the burrs 25 of the mounting electrodes 22 onto the circuit substrate 90 is significantly reduced or prevented. When the conductor 30 covers an entirety of the adjacent portions 22e, a short-circuit of the circuit substrate 90 due to drop of the burrs 25 of the mounting electrodes 22 onto the circuit substrate 90 is significantly reduced or prevented more reliably.

In the electronic component 100a or 100b according to the present preferred embodiment, the maximum length $L_b$ of the substrate terminal 20 is smaller than the maximum length $L_a$ of the capacitor element 10a or 10b in the lengthwise direction of the insulating substrate 21. Therefore, the adjacent portions 22e are easily covered by the conductor 30.

Further, in the present preferred embodiment, the capacitor element 10a or 10b covers an entirety of the substrate terminal 20 when seen from the above. Therefore, the adjacent portions 22e are easily covered by the conductor 30 reliably.

In the electronic component 100a or 100b according to the present preferred embodiment, the mounting electrodes 22 are spaced apart from the third and fourth side surfaces 21d of the insulating substrate 21 when seen from the above. With this, when the capacitor element 10a or 10b is mounted on the substrate terminal 20, an occurrence of positional deviation of the capacitor element 10a or 10b on the substrate terminal 20, in particular, positional deviation of the capacitor element 10a or 10b due to rotation thereof on the substrate terminal 20 is significantly reduced or prevented. Accordingly, bonding of the capacitor elements 100a or 100b that are mounted so as to be adjacent to each other is significantly reduced or prevented.

In the electronic component 100a or 100b according to the present preferred embodiment, the maximum length $L_2$ of each adjacent portion 22e is smaller than the maximum length $L_1$ of each mounting electrode 22 in the lengthwise direction of the insulating substrate 21. With this, when the capacitor element 10a or 10b is mounted on the substrate terminal 20, positional deviation that the capacitor element 10a or 10b approaches the first and second side surfaces of the substrate terminal 20 on the substrate terminal 20 is significantly reduced or prevented.

In the electronic component 100a or 100b according to the present preferred embodiment, the adjacent portions 22e are covered by the capacitor element 10a or 10b when seen from the above. This prevents a load from being applied from be by an external force on the burrs of the mounting electrodes 22. To be specific, the capacitor element 10a or 10b is located above the burrs of the mounting electrodes 22, so that the capacitor element 10a or 10b prevents contact between the burrs of the mounting electrodes 22 and other members. As a result, short-circuit of the circuit substrate 90 due to drop of the burrs of the mounting electrodes 22 onto the circuit substrate 90 is significantly reduced or prevented.

As described above, the electronic component 100a or 100b is accommodated in the package including the tape. In the case where the tape is made of paper, when the electronic component 100a or 100b is accommodated in the package or when the electronic component 100a or 100b is taken out of the package, nap is generated on the tape due to the burrs of the mounting electrodes 22. When the capacitor element 10a or 10b is mounted on the substrate terminal 20, if the nap is mixed into the solder, bonding strength between the capacitor element 10a or 10b and the substrate terminal 20 lowers in some cases. Further, the burrs of the mounting electrodes 22 are caught by the tape and the electronic component 100a or 100b cannot be taken out of the package in some cases. These are failures in mounting of the electronic component 100a or 100b due to the burrs of the mounting electrodes 22.

In the electronic component 100a or 100b according to the present preferred embodiment, generation of the burrs of the mounting electrodes 22 is significantly reduced or prevented. In addition, the conductor 30 covers at least a portion of the adjacent portions 22e. With this, nap that is generated due to the burrs of the mounting electrodes 22 is reduced so as to prevent mixing of the nap into the solder and catching tape by the burrs of the mounting electrodes 22 is significantly reduced or prevented.

Moreover, in the present preferred embodiment, the adjacent portions 22e are covered by the capacitor element 10a or 10b when seen from the above. Therefore, contact between the burrs of the mounting electrodes 22 and the tape is significantly reduced or prevented, thus further reducing the nap that is generated due to the burrs of the mounting electrodes 22.

Hereinafter, an electronic component according to a second preferred embodiment of the present invention will be described with reference to the drawings. The electronic component according to the present preferred embodiment is different from the electronic component 100a or 100b according to the first preferred embodiment only in the shapes of the mounting electrodes and description of other configurations is not repeated.

Second Preferred Embodiment

Figure 14:
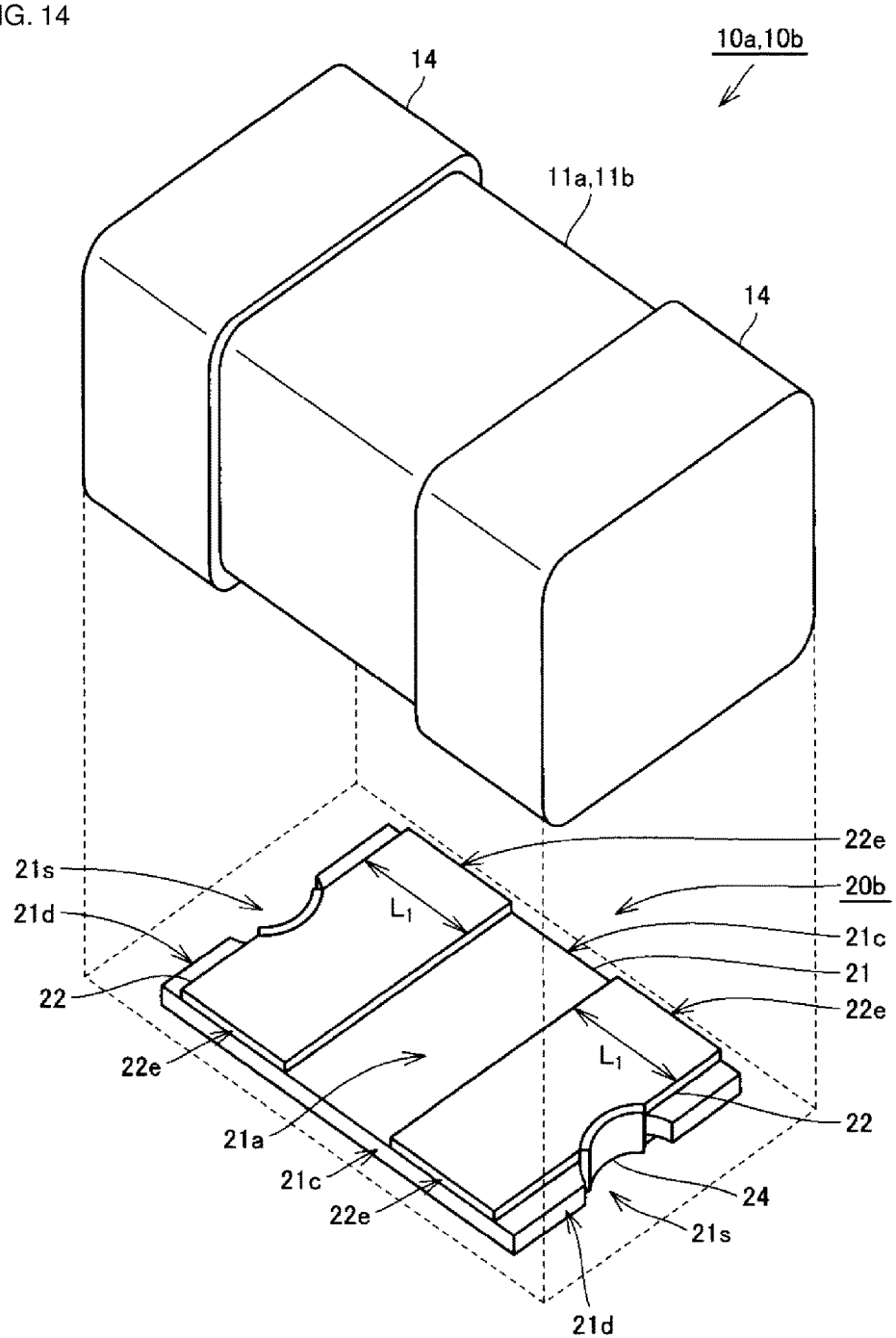
FIG. 14 is an exploded perspective view illustrating an electronic component according to a second preferred embodiment of the present invention.

FIG. 14 is an exploded perspective view illustrating the electronic component according to the second preferred embodiment of the present invention. In FIG. 14, a conductor included in the electronic component is not illustrated.

As illustrated in FIG. 14, in a substrate terminal 20b included in the electronic component according to the second preferred embodiment of the present invention, the length of each adjacent portion 22e in the lengthwise direction of the insulating substrate 21 is preferably equal or substantially equal to a maximum length $L_1$ of other portions of each mounting electrode 22.

Figure 15:
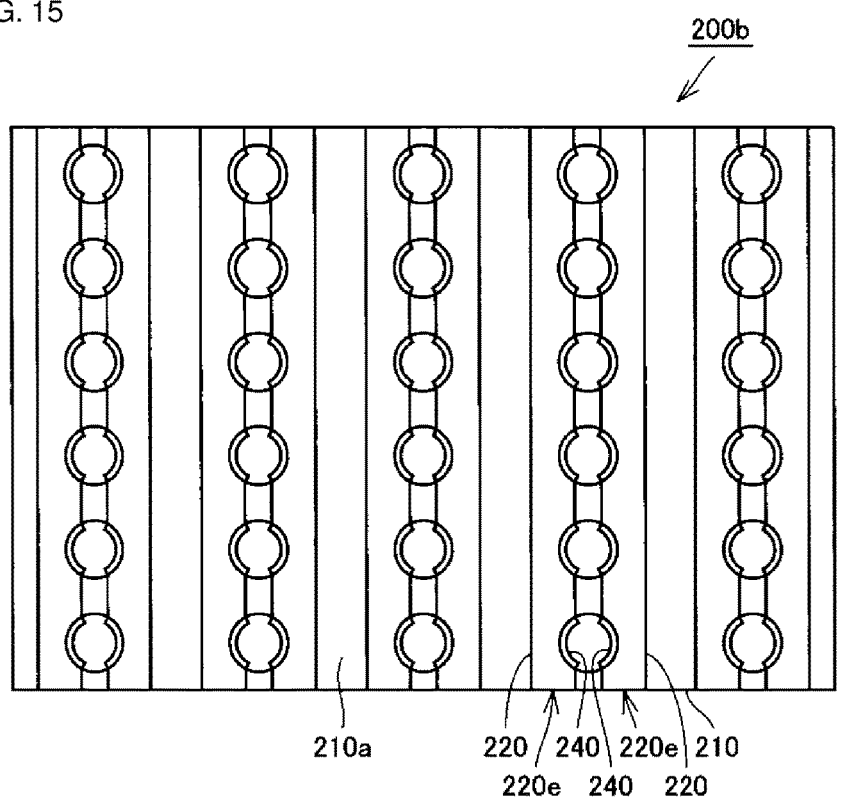
FIG. 15 is a view illustrating a mother substrate as a base of a substrate terminal included in the electronic component according to the second preferred embodiment of the present invention when seen from the first main surface side.
Figure 16:
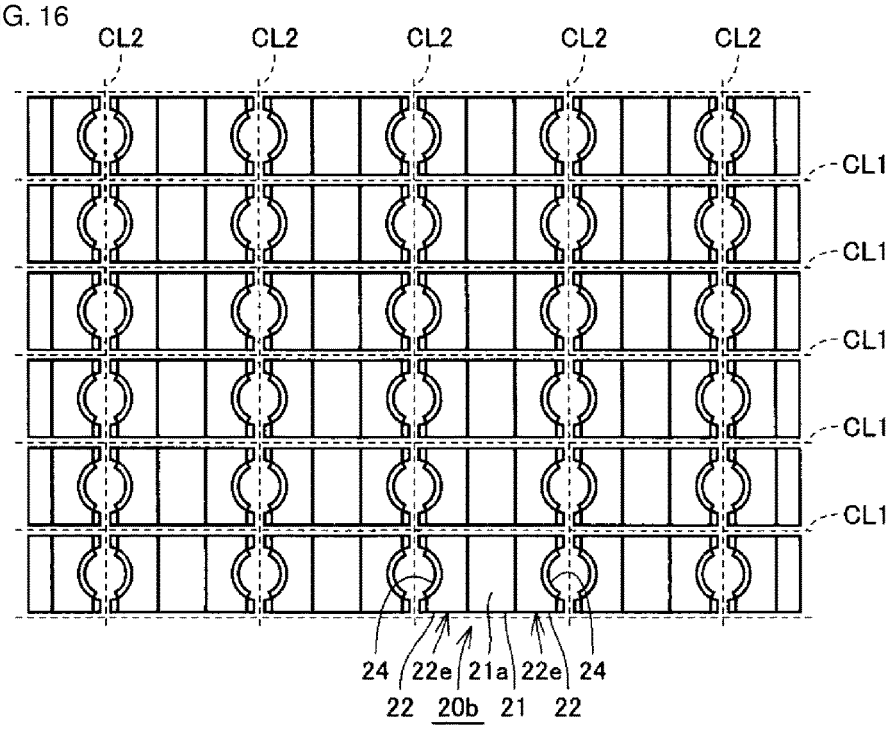
FIG. 16 is a view illustrating a cut mother substrate when seen from the first main surface side in the second preferred embodiment of the present invention.

FIG. 15 is a view illustrating a mother substrate as a base of a substrate terminal included in the electronic component according to the present preferred embodiment when seen from the first main surface side. FIG. 16 is a view illustrating a cut mother substrate when seen from the first main surface side in the present preferred embodiment.

As illustrated in FIGS. 15 and 16, a mother substrate 200b is cut along the cut lines CL1 and CL2 as virtual lines so as to be the individual substrate terminals 20b.

As illustrated in FIG. 15, in the mother substrate 200b according to the present preferred embodiment, the length of each coupling portion 220e in the lengthwise direction of the mother substrate is larger than that in the mother substrate 200a in the first preferred embodiment.

As illustrated in FIG. 16, in the substrate terminal 20b according to the present preferred embodiment, a maximum length of each adjacent portion 22e in the lengthwise direction of the insulating substrate 21 is larger than that in the substrate terminal 20 in the first preferred embodiment.

In the electronic component according to the present preferred embodiment, a bonding area of each outer electrode 14 and each mounting electrode 22 can be made larger than that in the electronic component 100a or 100b according to the first preferred embodiment. Therefore, bonding strength between the capacitor element 10a or 10b and the substrate terminal 20b is enhanced.

Hereinafter, an electronic component according to a third preferred embodiment of the present invention will be described with reference to the drawings. The electronic component according to the present preferred embodiment is different from the electronic component 100a or 100b according to the first preferred embodiment only in the shapes of connection electrodes and description of other configurations is not repeated.

Third Preferred Embodiment

Figure 17:
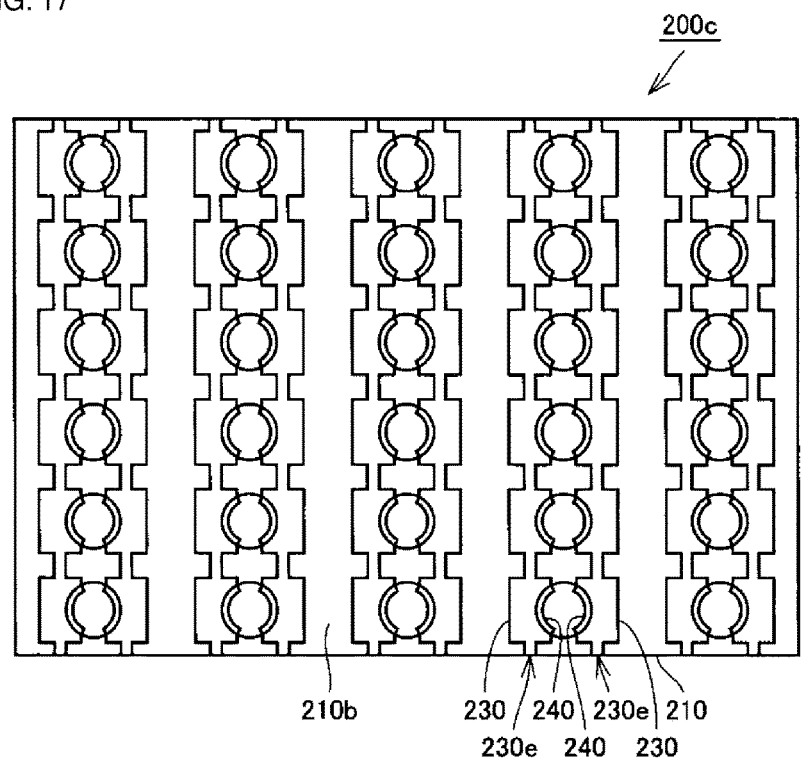
FIG. 17 is a view illustrating a mother substrate as a base of a substrate terminal included in an electronic component according to a third preferred embodiment of the present invention when seen from the second main surface side.
Figure 18:
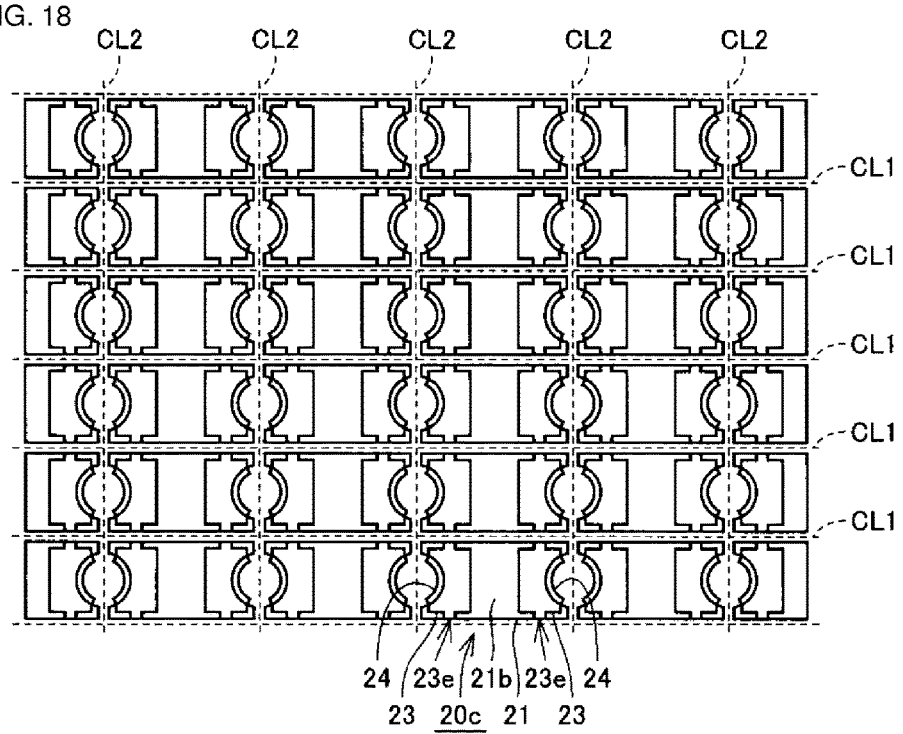
FIG. 18 is a view illustrating a cut mother substrate when seen from the second main surface side in the third preferred embodiment of the present invention.

FIG. 17 is a view illustrating a mother substrate as a base of a substrate terminal included in the electronic component according to the third preferred embodiment of the present invention when seen from the second main surface side. FIG. 18 is a view illustrating a cut mother substrate when seen from the second main surface side in the present preferred embodiment.

As illustrated in FIGS. 17 and 18, a mother substrate 200c is cut along the cut lines CL1 and CL2 as virtual lines so as to be individual substrate terminals 20c.

As illustrated in FIG. 17, in the mother substrate 200c as the base of the substrate terminal included in an electronic component according to the present preferred embodiment, a wiring pattern on the second main surface 210b has a configuration such that the plurality of electrodes 230 are coupled by coupling portions 230e as in the wiring pattern on the first main surface 210a.

As illustrated in FIGS. 17 and 18, in the second main surface 210b of the mother substrate 200c, the coupling portions 230e are located on the cut lines CL1, so that the coupling portions 230e are cut by the dicing blade 1.

As illustrated in FIG. 18, in the second main surface 21b of the substrate terminal 20c in the present preferred embodiment, cut portions of the coupling portions 230e correspond to adjacent portions 23e and the electrodes 230 after the coupling portions 230e are cut correspond to the connection electrodes 23. Burrs on the cut portions of the coupling portions 230e are burrs of the connection electrodes 23. That is to say, in the present preferred embodiment, the connection electrodes 23 include the adjacent portions 23e.

In the present preferred embodiment, the mother substrate 200c is cut from the second main surface 210b side by the dicing blade 1.

In this case, when the coupling portions 220e are cut by the dicing blade 1, the insulating substrate 210 is not located at the lower side of the coupling portions 220e. Therefore, the cut portions of the coupling portions 220e are made to extend by the dicing blade 1. Due to this, burrs are generated on the cut portions of the coupling portions 220e in some cases.

On the other hand, when the coupling portions 230e are cut by the dicing blade 1, the insulating substrate 210 is located at the lower side of the coupling portions 230e. Therefore, extension of the cut portions of the coupling portion 230e by the dicing blade 1 is prevented by the insulating substrate 210. As a result, burrs that are generated by the extension of the cut portions of the coupling portions 230e are significantly reduced or prevented.

In the electronic component according to the present preferred embodiment, even when the burrs of the mounting electrodes 22 are generated, the conductor 30 covers at least a portion of the adjacent portions 22e of the mounting electrodes 22.

In the electronic component according to the present preferred embodiment, generation of the burrs on the adjacent portions 23e of the connection electrodes 23 is significantly reduced or prevented. In addition, the conductor 30 covers at least a portion of the adjacent portions 22e of the mounting electrodes 22. With this, failure in mounting of the electronic component due to the burrs of the mounting electrodes 22 and the burrs of the connection electrodes 23 is significantly reduced or prevented.

Hereinafter, an electronic component according to a fourth preferred embodiment of the present invention will be described with reference to the drawings. The electronic component according to the present preferred embodiment is different from the electronic component according to the second preferred embodiment only in the shapes of connection electrodes and description of other configurations is not repeated.

Fourth Preferred Embodiment

Figure 19:
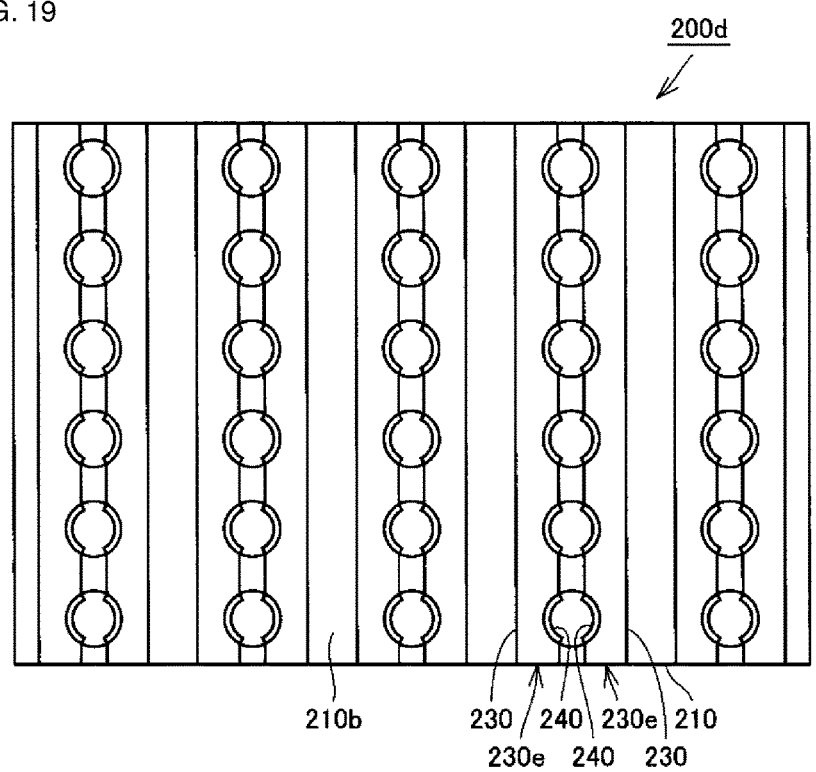
FIG. 19 is a view illustrating a mother substrate as a base of a substrate terminal included in an electronic component according to a fourth preferred embodiment of the present invention when seen from the second main surface side.
Figure 20:
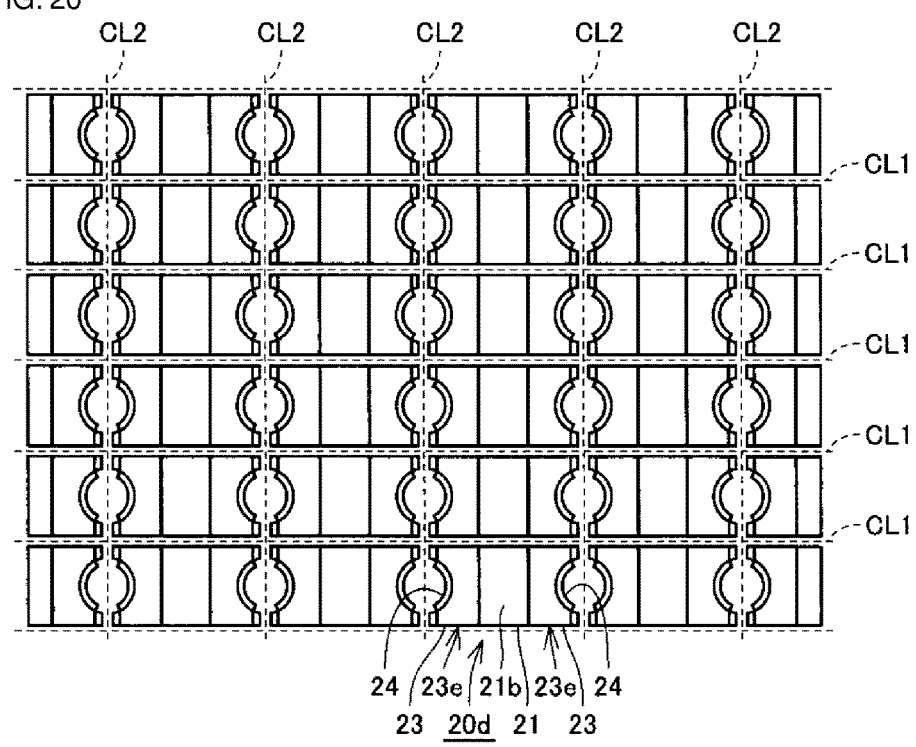
FIG. 20 is a view illustrating a cut mother substrate when seen from the second main surface side in the fourth preferred embodiment of the present invention.

FIG. 19 is a view illustrating a mother substrate as a base of a substrate terminal included in the electronic component according to the fourth preferred embodiment of the present invention when seen from the second main surface side. FIG. 20 is a view illustrating a cut mother substrate when seen from the second main surface side in the present preferred embodiment.

As illustrated in FIGS. 19 and 20, a mother substrate 200d is cut along the cut lines CL1 and CL2 as virtual lines so as to be individual substrate terminals 20d.

As illustrated in FIG. 19, in the mother substrate 200d as the base of the substrate terminal included in the electronic component in the present preferred embodiment, a wiring pattern on the second main surface 210b has a configuration that the plurality of electrodes 230 are coupled by the coupling portions 230e as in the wiring pattern on the first main surface 210a.

As illustrated in FIGS. 19 and 20, in the second main surface 210b of the mother substrate 200d, the coupling portions 230e are located on the cut lines CL1, so that the coupling portions 230e are cut by the dicing blade 1.

As illustrated in FIG. 20, in the second main surface 21b of the substrate terminal 20d in the present preferred embodiment, cut portions of the coupling portions 230e correspond to the adjacent portions 23e and the electrodes 230 after the coupling portions 230e are cut correspond to the connection electrodes 23. Burrs on the cut portions of the coupling portions 230e are burrs of the connection electrodes 23. That is to say, in the present preferred embodiment, the connection electrodes 23 include the adjacent portions 23e.

In the present preferred embodiment, the mother substrate 200d is cut from the second main surface 210b side by the dicing blade 1.

In this case, when the coupling portions 220e are cut by the dicing blade 1, the insulating substrate 210 is not located at the lower side of the coupling portions 220e. Therefore, the cut portions of the coupling portions 220e are made to extend by the dicing blade 1. Due to this, burrs are generated on the cut portions of the coupling portions 220e in some cases.

On the other hand, when the coupling portions 230e are cut by the dicing blade 1, the insulating substrate 210 is located at the lower side of the coupling portions 230e. Therefore, extension of the cut portions of the coupling portion 230e by the dicing blade 1 is prevented by the insulating substrate 210. As a result, burrs that are generated by the extension of the cut portions of the coupling portions 230e is significantly reduced or prevented.

In the electronic component according to the present preferred embodiment, even when the burrs of the mounting electrodes 22 are generated, the conductor 30 covers at least a portion of the adjacent portions 22e of the mounting electrodes 22.

That is to say, in the electronic component according to the present preferred embodiment, generation of the burrs on the adjacent portions 23e of the connection electrodes 23 is significantly reduced or prevented. In addition, the conductor 30 covers at least a portion of the adjacent portions 22e of the mounting electrodes 22. With this, failure in mounting of the electronic component due to the burrs of the mounting electrodes 22 and the burrs of the connection electrodes 23 is significantly reduced or prevented.

As illustrated in FIG. 19, in the mother substrate 200d according to the present preferred embodiment, the length of each coupling portion 230e in the lengthwise direction of the mother substrate is larger than that in the mother substrate 200c according to the third preferred embodiment.

As illustrated in FIG. 20, in the substrate terminal 20d according to the present preferred embodiment, a maximum length of each adjacent portion 23e in the lengthwise direction of the insulating substrate 21 is larger than that in the substrate terminal 20c according to the third preferred embodiment.

In the electronic component according to the present preferred embodiment, a bonding area of each connection electrode 23 and each land 91 is made larger than that in the electronic component according to the third preferred embodiment. Therefore, bonding strength between the substrate terminal 20d and the circuit substrate 90 is improved.

Hereinafter, an electronic component according to a fifth preferred embodiment of the present invention will be described with reference to the drawings. The electronic component according to the present preferred embodiment is different from the electronic component 100a or 100b according to the first preferred embodiment mainly in the shapes and the positions of through-electrodes and description of other configurations is not repeated.

Fifth Preferred Embodiment

Figure 21:
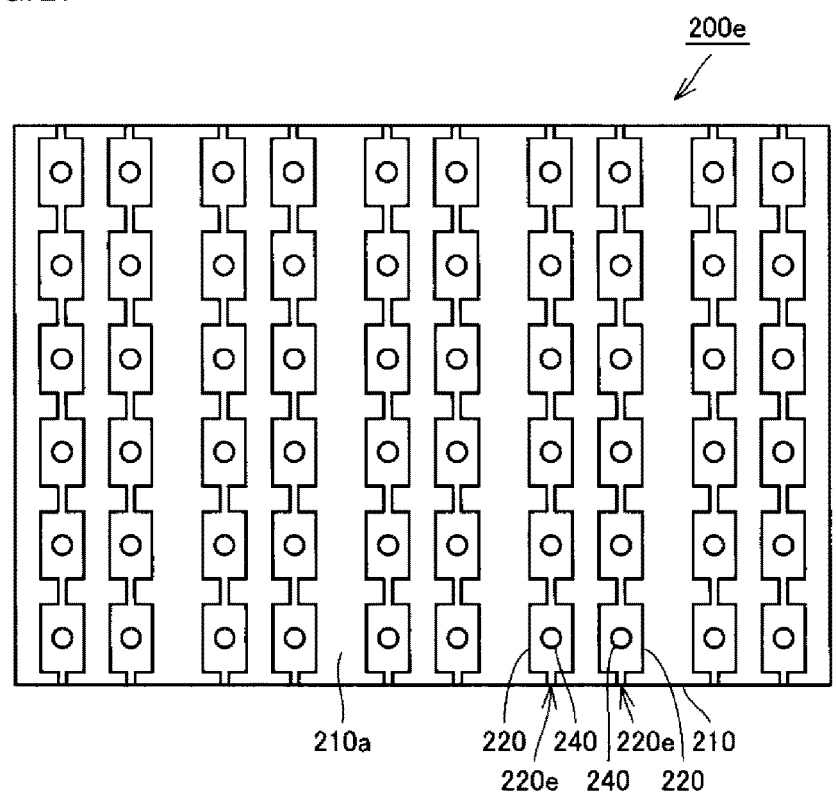
FIG. 21 is a view illustrating a mother substrate as a base of a substrate terminal included in an electronic component according to a fifth preferred embodiment of the present invention when seen from the first main surface side.
Figure 22:
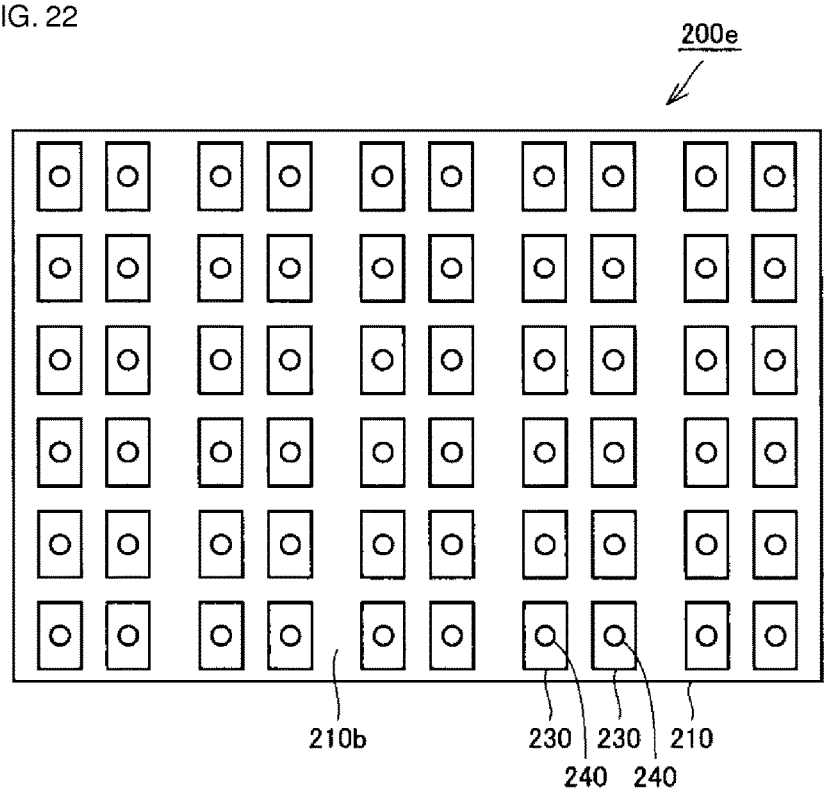
FIG. 22 is a view illustrating the mother substrate as the base of the substrate terminal included in the electronic component according to the fifth preferred embodiment of the present invention when seen from the second main surface side.

FIG. 21 is a view illustrating a mother substrate as a base of a substrate terminal included in the electronic component according to a fifth preferred embodiment of the present invention when seen from the first main surface side. FIG. 22 is a view illustrating the mother substrate as the base of the substrate terminal included in the electronic component according to the present preferred embodiment when seen from the second main surface side.

As illustrated in FIGS. 21 and 22, in a mother substrate 200e as the base of the substrate terminal included in the electronic component according to the fifth preferred embodiment of the present invention, the via holes 240 are located at substantially the respective centers of the electrodes 220 and the electrodes 230 and cause the electrode 220 and the electrode 230 to conduct to each other. The inside of each of via holes 240 is plated with a conductive material such as copper.

Figure 23:
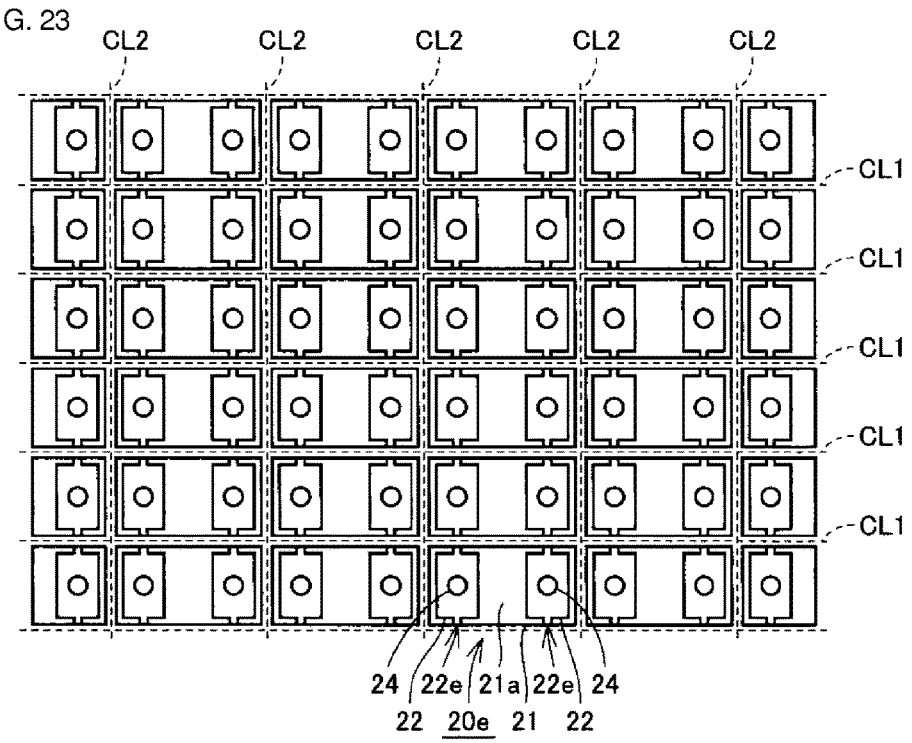
FIG. 23 is a view illustrating a cut mother substrate when seen from the first main surface side in the fifth preferred embodiment of the present invention.
Figure 24:
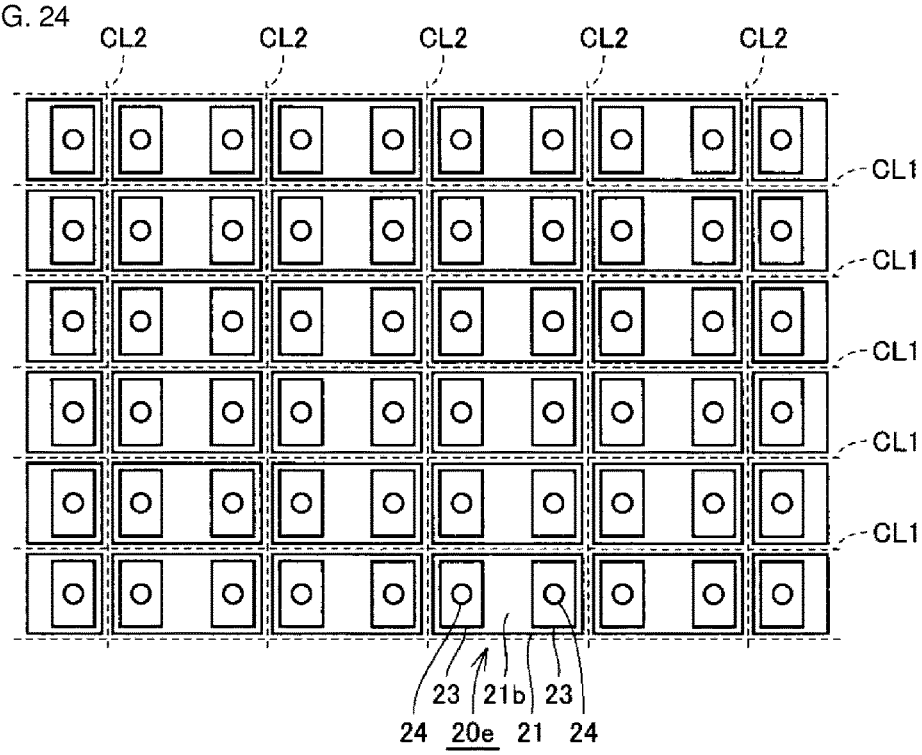
FIG. 24 is a view illustrating the cut mother substrate when seen from the second main surface side in the fifth preferred embodiment of the present invention.

FIG. 23 is a view illustrating a cut mother substrate when seen from the first main surface side in the present preferred embodiment. FIG. 24 is a view illustrating the cut mother substrate when seen from the second main surface side in the present preferred embodiment.

As illustrated in FIGS. 23 and 24, the mother substrate 200e is cut along the cut lines CL1 and CL2 as virtual lines so as to be individual substrate terminals 20e.

In the substrate terminal 20e according to the present preferred embodiment, the columnar through-electrodes 24 are located at or substantially at the respective centers of the mounting electrodes 22 and the connection electrodes 23. As a result, in the electronic component according to the present preferred embodiment, the through-electrodes 24 are located at the center side of the capacitor element 10a or 10b so as to reduce a loop inductance in the electronic component in comparison with the electronic component 100a or 100b according to the first preferred embodiment.

Hereinafter, an electronic component according to a sixth preferred embodiment of the present invention will be described with reference to the drawings. The electronic component according to the present preferred embodiment is different from the electronic component according to the fifth preferred embodiment mainly in the positions of the adjacent portions and description of other configurations is not repeated.

Sixth Preferred Embodiment

Figure 25:
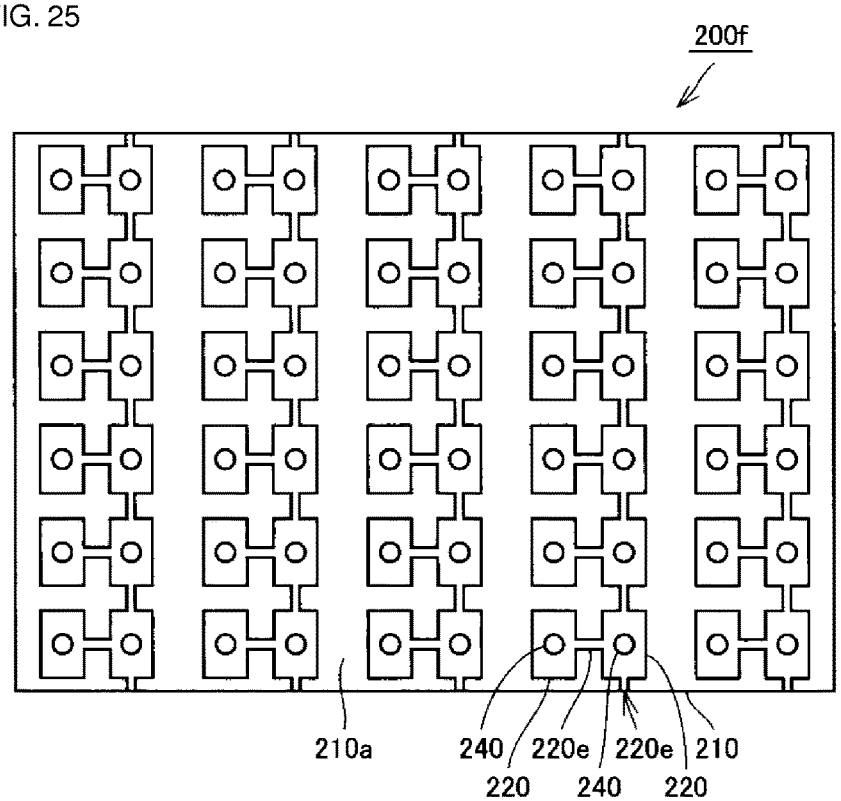
FIG. 25 is a view illustrating a mother substrate as a base of a substrate terminal included in an electronic component according to a sixth preferred embodiment of the present invention when seen from the first main surface side.
Figure 26:
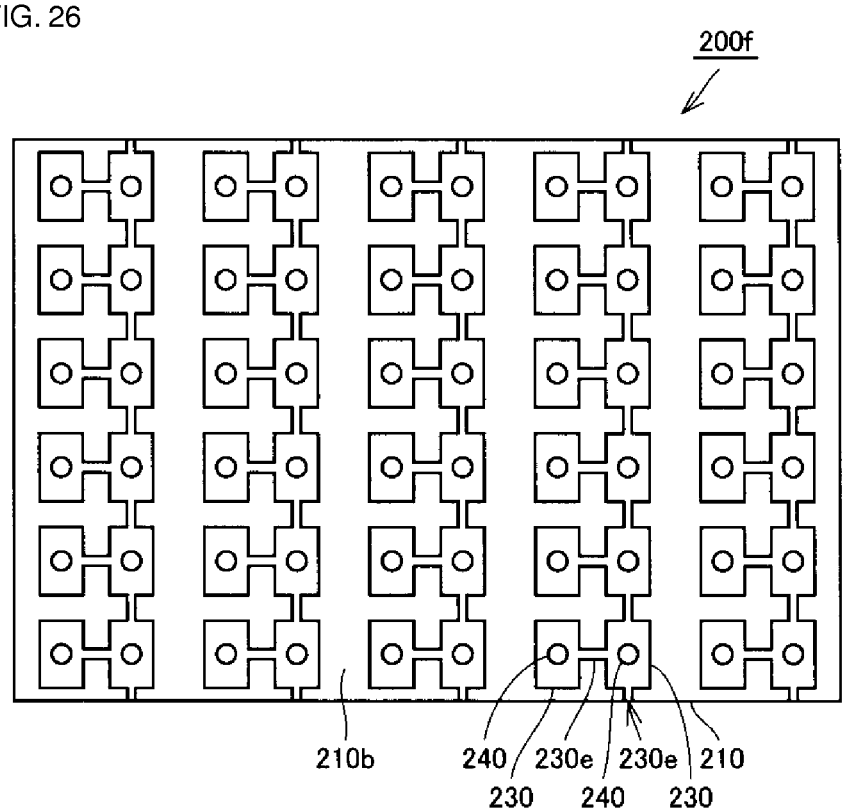
FIG. 26 is a view illustrating the mother substrate as the base of the substrate terminal included in the electronic component according to the sixth preferred embodiment of the present invention when seen from the second main surface side.

FIG. 25 is a view illustrating a mother substrate as a base of a substrate terminal included in the electronic component according to the sixth preferred embodiment of the present invention when seen from the first main surface side. FIG. 26 is a view illustrating the mother substrate as the base of the substrate terminal included in the electronic component in the present preferred embodiment when seen from the second main surface side.

As illustrated in FIGS. 25 and 26, in a mother substrate 200*f* as the base of the substrate terminal included in the electronic component in the present preferred embodiment, the coupling portions 220*e* extend along the straight line alternately in the width direction of the mother substrate 200*f* and the lengthwise direction of the mother substrate 200*f*. In the same manner, the coupling portions 230*e* extend along the straight line alternately in the width direction of the mother substrate 200*f* and the lengthwise direction of the mother substrate 200*f*. With this, when metal-plating is performed, a direct current is made to flow through all the electrodes 220, the electrodes 230, and the via holes 240.

Figure 27:
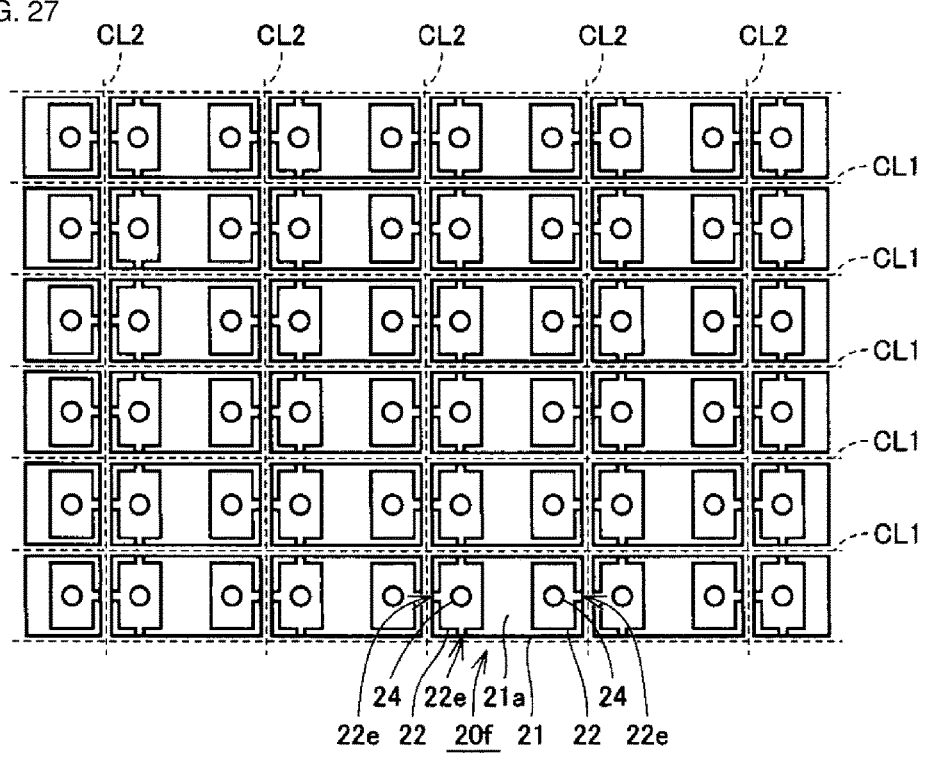
FIG. 27 is a view illustrating the cut mother substrate when seen from the first main surface side in the sixth preferred embodiment of the present invention.
Figure 28:
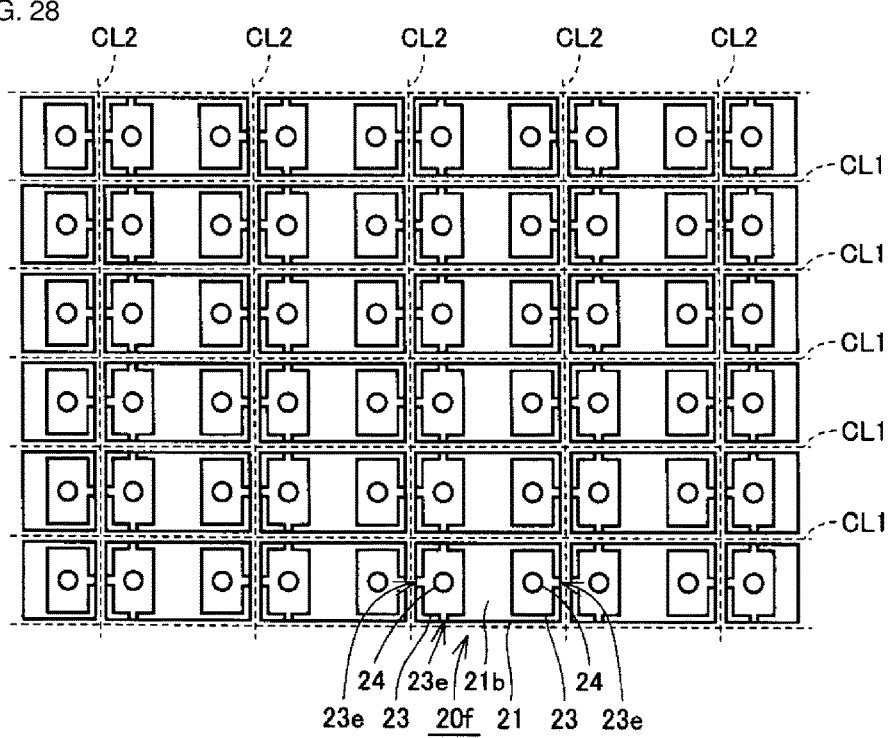
FIG. 28 is a view illustrating the cut mother substrate when seen from the second main surface side in the sixth preferred embodiment of the present invention.

FIG. 27 is a view illustrating a cut mother substrate when seen from the first main surface side in the present preferred embodiment. FIG. 28 is a view illustrating the cut mother substrate when seen from the second main surface side in the present preferred embodiment.

As illustrated in FIGS. 27 and 28, the mother substrate 200*f* is cut along the cut lines CL1 and CL2 as virtual lines so as to be individual substrate terminals 20*f*.

In the first main surface 210*a* of the mother substrate 200*f*, the coupling portions 220*e* are located on the cut lines CL1 and the cut lines CL2, so that the coupling portions 220*e* are cut by the dicing blade 1.

In the second main surface 210*b* of the mother substrate 200*f*, the coupling portions 230*e* are located on the cut lines CL1 and the cut lines CL2, so that the coupling portions 220*e* are cut by the dicing blade 1.

In the present preferred embodiment, the mother substrate 200*f* is cut from the second main surface 210*b* side by the dicing blade 1.

In this case, when the coupling portions 220*e* are cut by the dicing blade 1, the insulating substrate 210 is not located at the lower side of the coupling portions 220*e*. Therefore, the cut portions of the coupling portions 220*e* are made to extend by the dicing blade 1. Due to this, burrs are generated on the cut portions of the coupling portions 220*e* in some cases.

On the other hand, when the coupling portions 230*e* are cut by the dicing blade 1, the insulating substrate 210 is located at the lower side of the coupling portions 230*e*. Therefore, extension of the cut portions of the coupling portion 230*e* by the dicing blade 1 is prevented by the insulating substrate 210. As a result, burrs that are generated by the extension of the cut portions of the coupling portions 230*e* are significantly reduced or prevented.

In the electronic component according to the present preferred embodiment, even when the burrs of the mounting electrodes 22 are generated, the conductor 30 covers at least a portion of the adjacent portions 22*e* on both of the first and second side surfaces and the third and fourth side surfaces of the substrate terminal 20*f*.

That is to say, in the electronic component according to the present preferred embodiment, generation of the burrs on the adjacent portions 23*e* of the connection electrodes 23 is significantly reduced or prevented. In addition, the conductor 30 covers at least a portion of the adjacent portions 22*e* of the mounting electrodes 22. With this, failure in mounting of the electronic component due to the burrs of the mounting electrodes 22 and the burrs of the connection electrodes 23 is significantly reduced or prevented.

It should be considered that the preferred embodiments disclosed herein are exemplary in all the points and not limiting. The scope of the present invention is defined not by the above-mentioned description but by the scope of the present invention as follows and encompasses all the changes within meanings and ranges equivalent to the scope of the invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
   an electronic element including an outer electrode on a surface;
   a substrate terminal on which the electronic element is mounted; and
   a conductor that covers at least a portion of the substrate terminal; wherein
   the substrate terminal includes a first main surface, a second main surface opposite to the first main surface, and a peripheral surface connecting the first main surface and the second main surface;
   the substrate terminal has a rectangular or substantially rectangular outer shape when seen from a height direction perpendicular or substantially perpendicular to the first main surface;
   the peripheral surface of the substrate terminal includes first and second side surfaces opposite to each other and third and fourth side surfaces connecting the first and second side surfaces opposite to each other;
   a maximum length of the substrate terminal is smaller than a maximum length of the electronic element in a direction perpendicular or substantially perpendicular to the third and fourth side surfaces;
   the substrate terminal includes a mounting electrode on the first main surface electrically connected to the outer electrode of the electronic element;
   the mounting electrode includes an adjacent portion that is adjacent to the peripheral surface of the substrate terminal;
   the conductor covers at least a portion of the adjacent portion;
   the conductor is disposed directly between and directly contacts opposing surfaces of the outer electrode and the mounting electrode;
   the substrate terminal is an interposer substrate; and
   the conductor interconnects only the electronic element and the substrate terminal.

2. The electronic component according to claim 1, wherein the conductor covers an entirety of the adjacent portion.

3. The electronic component according to claim 1, wherein the adjacent portion is covered by the electronic element when seen from a height direction perpendicular or substantially perpendicular to the first main surface.

4. The electronic component according to claim 1, wherein a maximum width of the substrate terminal is smaller than a maximum width of the electronic element in a direction perpendicular or substantially perpendicular to the first and second side surfaces.

5. The electronic component according to claim 1, wherein an entirety of the substrate terminal is covered by the electronic element when seen from a height direction perpendicular or substantially perpendicular to the first main surface.

6. The electronic component according to claim 1, wherein the mounting electrode includes two adjacent portions that are adjacent to the first and second side surfaces, respectively.

7. The electronic component according to claim 1, wherein the mounting electrode is spaced apart from the third and fourth side surfaces when seen from a height direction perpendicular or substantially perpendicular to the first main surface.

8. The electronic component according to claim 1, wherein a maximum length of the adjacent portion is smaller than a maximum length of the mounting electrode in a direction perpendicular or substantially perpendicular to the third and fourth side surfaces.

9. The electronic component according to claim 1, wherein the conductor is solder and electrically connects the outer electrode and the mounting electrode.

10. The electronic component according to claim 1, wherein
the adjacent portion includes a burr of the mounting electrode; and
the conductor fixes the burr.

11. The electronic component according to claim 1, wherein the electronic element is one of a capacitor element, an inductor element, a thermistor element, a piezoelectric element, and a semiconductor element.

12. The electronic component according to claim 1, wherein the electronic element includes a plurality of dielectric layers and a plurality of conductors laminated on each other in a lamination direction.

13. The electronic component according to claim 12, wherein the lamination direction is perpendicular or substantially perpendicular to a lengthwise direction of the electronic element and a height direction of the electronic element.

14. The electronic component according to claim 1, wherein the substrate terminal includes an insulating substrate including cutouts having a half-oval, substantially half-oval, half-ellipsoid or substantially half-ellipsoid shape when seen from a height direction perpendicular or substantially perpendicular to the first main surface, the cutouts are provided at both ends of the insulating substrate in a lengthwise direction thereof.

15. The electronic component according to claim 14, wherein solder is provided in the cutouts.

16. The electronic component according to claim 1, wherein the substrate terminal includes a through-electrode that electrically connects the mounting electrode and a connection electrode.

* * * * *